United States Patent
Choi et al.

(10) Patent No.: US 12,484,425 B2
(45) Date of Patent: Nov. 25, 2025

(54) DISPLAY PANEL AND DISPLAY APPARATUS INCLUDING THE SAME

(71) Applicant: Samsung Display Co., Ltd., Yongin-Si (KR)

(72) Inventors: Nakcho Choi, Yongin-si (KR); Daegi Kweon, Yongin-si (KR); Seongmin Cho, Yongin-si (KR); Jihee Kim, Yongin-si (KR); Chiwook An, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 318 days.

(21) Appl. No.: 17/194,364

(22) Filed: Mar. 8, 2021

(65) Prior Publication Data

US 2022/0077430 A1    Mar. 10, 2022

(30) Foreign Application Priority Data

Sep. 7, 2020    (KR) .................. 10-2020-0114114

(51) Int. Cl.
*H10K 59/80*  (2023.01)
*H10K 59/121* (2023.01)
(Continued)

(52) U.S. Cl.
CPC ..... *H10K 59/8792* (2023.02); *H10K 59/1213* (2023.02); *H10K 59/122* (2023.02);
(Continued)

(58) Field of Classification Search
CPC ............. H10K 59/1213; H10K 59/122; H10K 59/126; H10K 59/352; H10K 59/353; H10K 59/38; H10K 59/65; H10K 59/8792
See application file for complete search history.

(56) References Cited

U.S. PATENT DOCUMENTS

| | | | |
|---|---|---|---|
| 8,866,170 B2 | 10/2014 | Moon et al. | |
| 9,761,651 B2 | 9/2017 | Chang et al. | |

(Continued)

FOREIGN PATENT DOCUMENTS

| | | |
|---|---|---|
| CN | 110061038 A | 7/2019 |
| CN | 110444125 A | 11/2019 |

(Continued)

OTHER PUBLICATIONS

Extended European Search Report, Application No. 21186512.6, dated Jun. 7, 2022, 6 pages.

*Primary Examiner* — Marcos D. Pizarro
(74) *Attorney, Agent, or Firm* — Innovation Counsel LLP

(57) ABSTRACT

A display apparatus including the display panel, the display panel includes: a substrate in which a main display area, a component area and an intermediate area are defined; pixel electrodes including a first pixel electrode arranged in the main display area, a second pixel electrode arranged in the component area and a third pixel electrode arranged in the intermediate area; a first insulating layer including a light-blocking material and disposed on the substrate, the first insulating layer exposing central portions of pixel electrodes; and an optical functional layer arranged on the first insulating layer and including a black matrix, the black matrix exposing the pixel electrodes, wherein the first insulating layer at least partially overlaps the black matrix in an intermediate area between the main display area and the component area.

24 Claims, 25 Drawing Sheets

(51) Int. Cl.
  *H10K 59/122* (2023.01)
  *H10K 59/126* (2023.01)
  *H10K 59/35* (2023.01)
  *H10K 59/38* (2023.01)
  *H10K 59/65* (2023.01)
(52) U.S. Cl.
  CPC ......... *H10K 59/126* (2023.02); *H10K 59/352* (2023.02); *H10K 59/353* (2023.02); *H10K 59/38* (2023.02); *H10K 59/65* (2023.02)

(56) References Cited

U.S. PATENT DOCUMENTS

| | | |
|---|---|---|
| 10,685,202 B2 | 6/2020 | Kim et al. |
| 10,847,586 B2 | 11/2020 | Lee |
| 2019/0198802 A1 | 6/2019 | Lee et al. |
| 2019/0245017 A1 | 8/2019 | Jeon et al. |
| 2020/0176538 A1* | 6/2020 | Um ...................... H10K 59/126 |
| 2020/0194721 A1* | 6/2020 | Lee ...................... H10K 59/874 |
| 2020/0258953 A1* | 8/2020 | Bae ........................ H10K 59/60 |

FOREIGN PATENT DOCUMENTS

| | | | |
|---|---|---|---|
| KR | 10-2016-0117728 A | 10/2016 | |
| KR | 10-1842585 B1 | 3/2018 | |
| KR | 10-2018-0034750 A | 4/2018 | |
| KR | 10-2019-0077878 A | 7/2019 | |
| KR | 10-2019-0096472 A | 8/2019 | |
| KR | 10-2020-0039859 A | 4/2020 | |
| KR | 10-2020-0069082 A | 6/2020 | |
| WO | WO-2021147081 A1 * | 7/2021 | ............. H10K 77/10 |

* cited by examiner

DISPLAY PANEL AND DISPLAY APPARATUS INCLUDING THE SAME

CROSS-REFERENCE TO RELATED APPLICATION

This application is based on and claims priority under 35 U.S.C. § 119 to Korean Patent Application No. 10-2020-0114114, filed on Sep. 7, 2020, in the Korean Intellectual Property Office, the disclosure of which is incorporated by reference herein in its entirety.

BACKGROUND

1. Field

One or more embodiments relate to a display panel and a display apparatus including the same, and more particularly, to a display panel in which boundary visibility in a component area is reduced, and a display apparatus including the display panel.

2. Description of Related Art

Recently, the usage of display devices has diversified. In addition, as display devices have become thinner and lighter, their range of use has gradually been extended.

As the area occupied by a display area in display apparatuses has expanded, various functions that are combined or associated with the display apparatuses have been added. To add various functions while expanding the area of the display area, research has been carried out on a display apparatus including a region for adding various functions other than displaying an image inside the display area.

SUMMARY

To add various functions, a component such as a camera or a sensor may be arranged. To arrange a component while securing a wider area of a display area, the component may be arranged to overlap the display area. As one of ways of arranging a component, a display apparatus may include a transmission area through which a wavelength such as light or sound may pass.

However, in a display apparatus according to the related art, a boundary is well viewed during a design process of extending a display area.

One or more embodiments include a display panel in which boundary visibility in a component area is reduced, and a display apparatus including the display panel. However, such a technical problem is an example, and the disclosure is not limited thereto.

Additional aspects will be set forth in part in the description which follows and, in part, will be apparent from the description, or may be learned by practice of the presented embodiments of the disclosure.

According to one or more embodiments, a display panel includes: a substrate including a main display area, a component area under which at least one component is disposed and an intermediate area disposed between the main display area and the component area; pixel electrodes including a first pixel electrode disposed in the main display area, a second pixel electrode disposed in the component area, and a third pixel electrode disposed in the intermediate area; a first insulating layer including a light-blocking material and disposed on the substrate, the first insulating layer exposing central portions of pixel electrodes; and an optical functional layer disposed on the first insulating layer and including a black matrix, the black matrix exposing the pixel electrodes, wherein the light-blocking material and the black matrix are disposed in the main display area, either the light-blocking material or the black matrix is disposed in the intermediate display area, and the light-blocking material and the black matrix are not disposed in the component area.

The display panel may further include: a second insulating layer including a light-transmissive material and disposed in the component area, covering edges of the second pixel electrode, and including an opening that exposes a central portion of the second pixel electrode.

The optical functional layer may further include color filters disposed in areas corresponding to the pixel electrodes.

A spacer may be further including a spacer disposed on the first insulating layer and the second insulating layer. The spacer may include a same material as the second insulating layer.

The first insulating layer may at least partially overlap the second insulating layer.

At least a portion of the second insulating layer may be disposed on the first insulating layer in a portion where the first insulating layer overlaps the second insulating layer.

A width of the portion where the first insulating layer overlaps the second insulating layer in a plan view may be greater than a thickness of the first insulating layer.

A thickness of the second insulating layer in the portion where the first insulating layer overlaps the second insulating layer may be less than a thickness of the first insulating layer.

The light-blocking material may be disposed in the intermediate display area.

The black matrix may be disposed in the intermediate display area.

The light-blocking material may be disposed in areas corresponding to the main display area and the intermediate area and is not disposed in an area corresponding to the component area, and the black matrix may be disposed in an area corresponding to the main display area and is not disposed in areas corresponding to the intermediate area and the component area.

The light-blocking material is disposed in an area corresponding fi to the main display area and is not disposed in areas corresponding to the intermediate area and the component area, and the black matrix may be disposed in areas corresponding to the main display area and the intermediate area and is not disposed in an area corresponding to the component area.

The first insulating layer or the black matrix may be disposed in an area corresponding to the intermediate area.

An edge of the first insulating layer may have a zigzag shape.

An edge of the black matrix may have protrusions and recessions. The protrusions of the black matrix may be alternatingly disposed with protrusions of the first insulating layer in the intermediate area.

The component area may have a transmission area.

The first insulating layer may be disposed in an area corresponding to at least a portion of the component area that excludes the transmission area.

According to one or more embodiments, a display apparatus includes: a display panel including a main display area, a component area disposed between the main display area and the component area; and a component disposed below the display panel in an area corresponding to the component area, wherein the display panel includes: a substrate; a plurality of pixel electrodes including a first pixel electrode disposed in the main display area, a second pixel electrode disposed in the component area and a third pixel electrode disposed in the intermediate area; a first insulating layer including a light-blocking material and disposed on the substrate, the first insulating layer exposing central portions of pixel electrodes; and an optical functional layer disposed on the first insulating layer and including a black matrix, the black matrix exposing the pixel electrodes, wherein the light-blocking material and the black matrix are disposed in the main display area, either the light-blocking material or the black matrix is disposed in the intermediate display area, and the light-blocking material and the black matrix are not disposed in the component area.

The display apparatus may further include a second insulating layer disposed in an area corresponding to the component area, covering edges of the second pixel electrode, and including a second opening that exposes a central portion of the second pixel electrode, the second insulating layer including a light-transmissive material.

Reflectivity of the intermediate area may be greater than reflectivity of the main display area and less than reflectivity of the component area.

The component may include at least one of an illuminance sensor and a proximity sensor.

The component may include a camera.

The display apparatus may further include a spacer disposed on the first insulating layer. The second insulating layer and the spacer may include a same material.

The first insulating layer may at least partially overlap the second insulating layer.

These and/or other aspects will become apparent and more readily appreciated from the following detailed description of the embodiments, the accompanying drawings, and claims.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
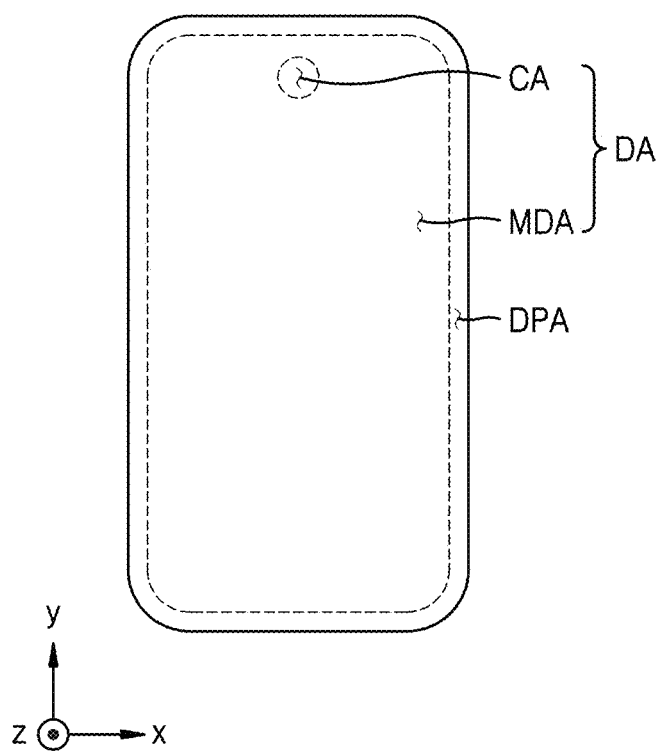
FIGS. 1, 2 and 3 are plan views of a display panel according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, wherein like reference numerals refer to like elements throughout and a repeated description thereof is omitted.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

In the present specification, "A and/or B" means A or B, or A and B. In the present specification, "at least one of A and B" means A or B, or A and B.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When an embodiment may be implemented differently, a certain process order may be performed differently from the described order. For example, two consecutively described processes may be performed substantially at the same time or performed in an order opposite to the described order.

Sizes of elements in the drawings may be exaggerated or reduced for convenience of explanation. For example, since sizes and thicknesses of elements in the drawings are arbitrarily illustrated for convenience of explanation, the disclosure is not limited thereto.

Figure 2:
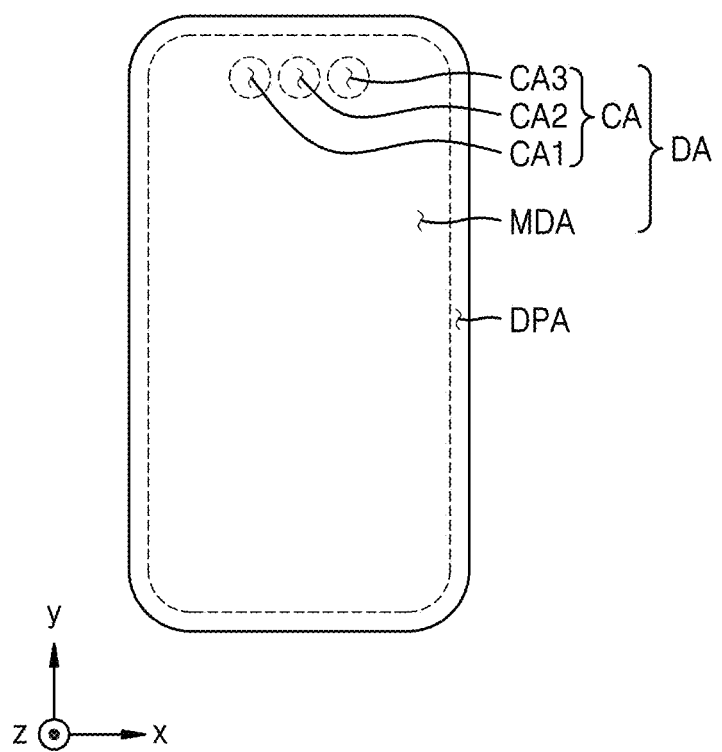
Figure 3:
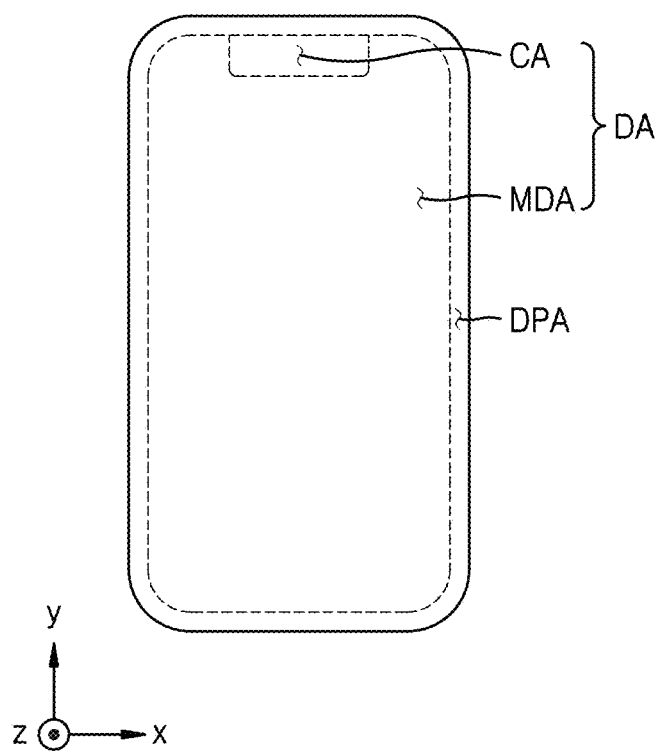

FIGS. 1 to 3 are plan views of a display panel 10 according to an embodiment.

The display panel 10 may include a light-emitting display panel including a light-emitting element. As an example, the display panel 10 may include an organic light-emitting display panel that uses an organic light-emitting diode including an organic emission layer, an ultra miniaturized light-emitting diode display panel that uses a micro light-emitting diode, a quantum-dot light-emitting display panel that uses a quantum-dot light-emitting diode including a quantum-dot emission layer, and an inorganic light-emitting display panel that uses an inorganic light-emitting element including an inorganic semiconductor.

The display panel 10 may be a rigid display panel that has strength and thus is not easily bent, or the display panel 10 may be a flexible display panel and thus is easily bendable, foldable, or rolled. As an example, the display panel 10 may include a foldable display panel that may be folded or unfolded, a curved display panel in which a display surface is bent, a bendable display panel in which a region excluding a display surface may be bent, a rollable display panel that may be rolled or unrolled, and a stretchable display panel that is stretchable.

The display panel 10 includes a display area DA and a peripheral area DPA, the display area DA displaying an image, and the peripheral area DPA not displaying an image. The display area DA includes a main display area MDA and a component area CA. The main display area MDA and the component area CA may individually display different images or display an image in cooperation with each other. The peripheral area DPA is a kind of non-display area in which display elements are not arranged. The display area DA may be entirely surrounded by the peripheral area DPA. A component, which is an electronic element, may be arranged below the component area CA.

The component may be a camera that uses an infrared or visible ray, etc. and may include an imaging element. Alternatively, the component may include solar batteries, flashes, illuminance sensors, proximity sensors, and iris sensors. Alternatively, the component may have a function of receiving sound. To reduce the limited functionality of the component, the component area CA may include a transmission area TA through which light and/or sound may pass.

In an embodiment, the component area CA may be a region having a higher light transmittance and/or a higher sound transmittance than the main display area MDA. In an embodiment, when light passes through the component area CA, light transmittance of the component area CA may be 10% or more, preferably 25% or more, 30% or more, 50% or more, 75% or more, 80% or more, 85% or more, or 90% or more.

The component area CA may be arranged inside the main display area MDA and surrounded by the main display area MDA. In addition, the component area CA may be provided in a circular shape and provided more than one. FIG. 1 shows one component area CA, and FIG. 2 shows three component areas CA1, CA2, and C3 as an example. Each of the first to third component areas CA1, CA2, and C3 may be surrounded by the main display area MDA. A first component may be arranged to correspond to the first component area CA1, a second component may be arranged to correspond to the second component area CA2, and a third component may be arranged to correspond to the third component area CA3. The first to third components may have different functions. In an embodiment, a camera may be arranged in the first component area CA1, an illuminance sensor may be arranged in the second component area CA2, and a proximity sensor may be arranged in the third component area CA3.

Though FIGS. 1 and 2 show the component area CA is circular, the embodiment is not limited thereto. As an example, the shape of the component area CA may be an elliptical shape or a polygonal shape such as a triangle or a pentagon as shown in FIG. 3. The location and size of the component area CA may be variously modified.

In the case of FIG. 3, a component area CA of a bar type extending in a direction (e.g. an x-direction) may be provided, and a plurality of components may be arranged to correspond to the component area CA. In the present embodiment, the component area CA may be partially surrounded by the main display area MDA, and at least a portion of the component area CA may contact the peripheral area DPA.

Figure 4:
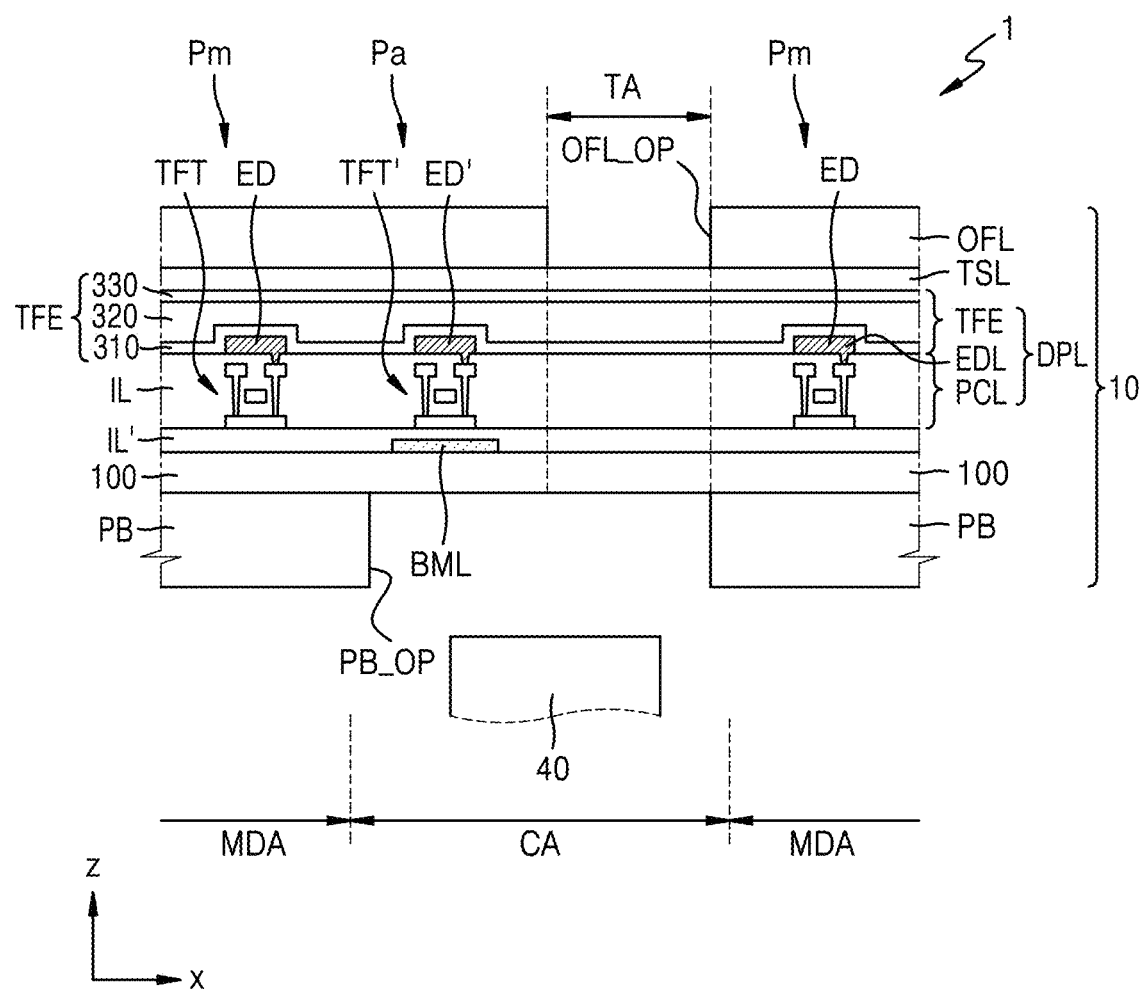
FIGS. 4 and 5 are cross-sectional views of a portion of a display apparatus according to an embodiment.
Figure 5:
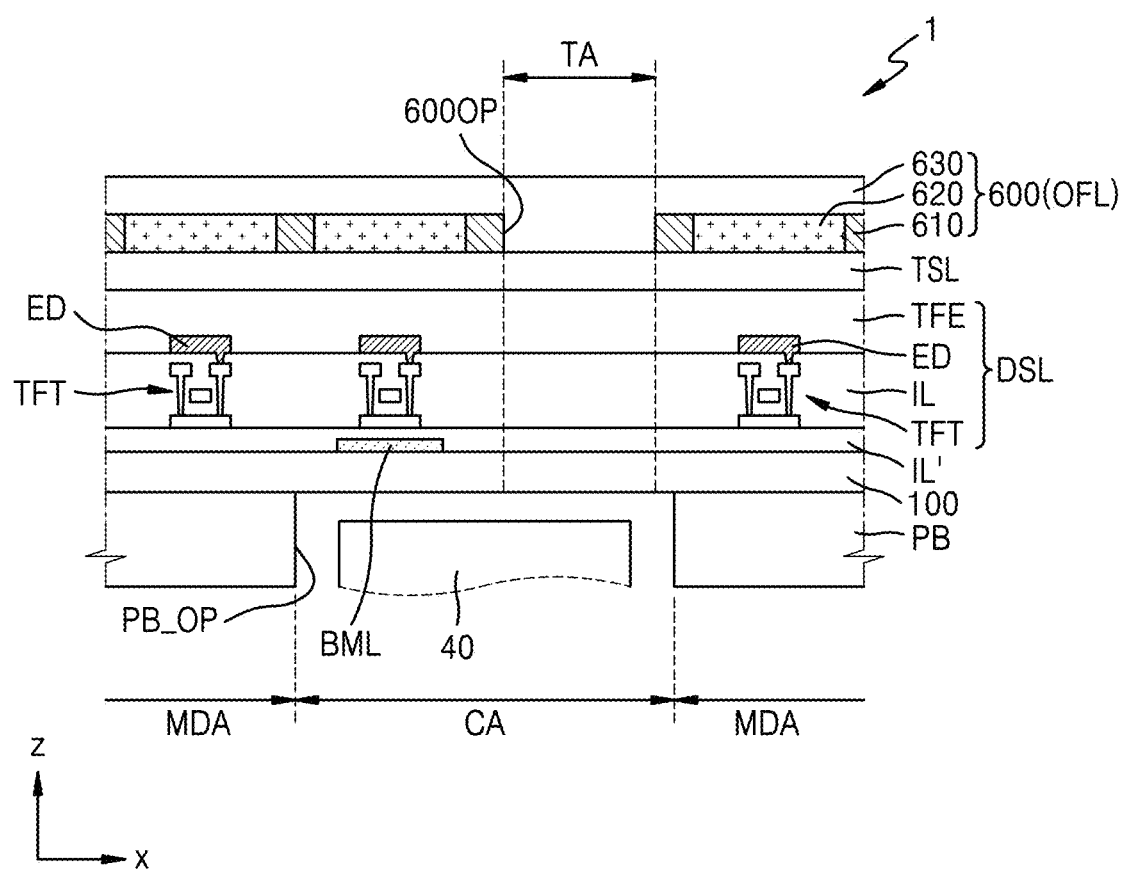

FIGS. 4 and 5 are cross-sectional views of a portion of a display apparatus 1 according to an embodiment.

Referring to FIGS. 4 and 5, the display apparatus 1 may include the display panel 10 and a component 40 overlapping the display panel 10. A cover window (not shown) may be further arranged on the display panel 10, the cover window protecting the display panel 10.

The display panel 10 includes the component area CA and the main display area MDA. The component area CA may overlap the component 40 and the main display area MDA may display a main image. The display panel 10 may include a substrate 100, a display layer DPL disposed over the substrate 100, a touchscreen layer TSL, an optical functional layer OFL, and a panel-protecting layer PB. The touchscreen layer TSL and the optical functional layer OFL may be disposed on the display layer DPL, and the panel-protecting layer PB may be disposed under the substrate 100.

The display layer DPL may include a circuit layer PCL, a display element layer EDL, and an encapsulation layer TFE. The circuit layer PCL may include thin-film transistors TFT, that is, a main thin-film transistor TFT and an auxiliary thin-film transistor TFT'. The display element layer EDL may include light-emitting elements, that is, a main light-emitting element ED and an auxiliary light-emitting element ED'. The encapsulation layer may include a thin-film encapsulation layer TFE or an encapsulation substrate (not shown). Insulating layers IL and IL' may be arranged between the substrate 100 and the display layer DPL and inside the display layer DPL.

A main sub-pixel Pm and a main thin-film transistor TFT connected thereto may be arranged in the main display area MDA of the display panel 10. The main sub-pixel Pm may include the main light-emitting element ED. An auxiliary sub-pixel Pa and an auxiliary thin-film transistor TFT' connected thereto may be arranged in the component area CA of the display panel 10. The auxiliary sub-pixel Pa may include the auxiliary light-emitting element ED'.

The transmission area TA may be arranged in the component area CA. A display element may not be arranged in the transmission area TA. The transmission area TA may be a region through which light/sound emitted from the component 40 or light/sound incident to the component 40 passes. The component 40 may be disposed in an area corresponding to the component area CA.

A bottom metal layer BML may be arranged in the component area CA to overlap the auxiliary thin-film transistor TFT' in a plan view. The bottom metal layer BML may be disposed under the auxiliary thin-film transistor TFT' to correspond to the auxiliary thin-film transistor TFT'. As an example, the bottom metal layer BML may be arranged between the auxiliary thin-film transistor TFT' and the substrate 100. The bottom metal layer BML may prevent external light from incident onto the auxiliary thin-film transistor TFT'. In an embodiment, a constant voltage or signal may be applied to the bottom metal layer BML.

The display element layer EDL may be covered by the thin-film encapsulation layer TFE or the encapsulation substrate. In an embodiment, the thin-film encapsulation layer TFE may include at least one inorganic encapsulation layer and at least one organic encapsulation layer. In an embodiment, the thin-film encapsulation layer TFE may include first and second inorganic encapsulation layers 310 and 330 and an organic encapsulation layer 320 disposed therebetween.

In the case where the display element layer EDL is sealed by the encapsulation substrate (not shown), the encapsulation substrate may face the substrate 100 with the display element layer EDL disposed therebetween. There may be a gap between the encapsulation substrate and the display element layer EDL. The encapsulation substrate may include glass. Sealant is arranged between the substrate 100 and the encapsulation substrate. The sealant may include frit and be arranged in the peripheral area DPA. The sealant arranged in the peripheral area DPA may prevent moisture from penetrating through lateral sides of the display area DA while surrounding the display area DA.

The touchscreen layer TSL may obtain coordinate information corresponding to an external input, for example, a touch event. The touchscreen layer TSL may include a touch electrode and touch wirings connected to the touch electrode. The touchscreen layer TSL may sense an external input by using self-capacitive method or a mutual capacitive method.

The touchscreen layer TSL may be formed on the thin-film encapsulation layer TFE. Alternatively, the touchscreen layer TSL may be separately formed on a touch substrate and then coupled on the thin-film encapsulation layer TFE through an adhesive layer such as an optically clear adhesive OCA. In an embodiment, the touchscreen layer TSL may be directly formed on the thin-film encapsulation layer TFE. In this case, an adhesive layer may not be arranged between the touchscreen layer TSL and the thin-film encapsulation layer TFE.

The optical functional layer OFL may include an anti-reflection layer. The anti-reflection layer may reduce the reflectivity of light (external light) incident toward the display apparatus 1 from the outside.

In an embodiment, the optical functional layer OFL may be a polarizing film. The optical functional layer OFL may include an opening OFL_OP corresponding to the transmission area TA. Accordingly, light transmittance of the transmission area TA may be remarkably improved. The opening OFL_OP may be filled with a transparent material such as an optically clear resin (OCR).

In an embodiment, as shown in FIG. 5, the optical functional layer OFL may include a filter plate including a black matrix and color filters. The filter plate 600 may include a black matrix 610, a color filter 620, and an overcoat layer 630. The color filters 620 may be selected according to the color of light emitted from each of the pixels of the display panel 10. As an example, the color filter 620 may selectively path red light, green light, or blue light depending on the color of light emitted from the light-emitting elements, that is, the main light-emitting element ED and the auxiliary light-emitting element ED'. There is no color filter 620 and no black matrix 610 in the transmission area TA. As an example, the layer including the color filter 620 and the black matrix 610 may include a hole 6000P corresponding to the transmission area TA. A portion of the hole 6000P may be at least partially filled with the overcoat layer 630. The overcoat layer 630 may include an organic material such as a resin. The organic material may be transparent.

A display apparatus including the optical functional layer OFL that includes the color filter 620 and the black matrix 610 may have a remarkably reduced thickness compared to a display apparatus including a polarizing plate.

The cover window (not shown) may be arranged on the display panel 10 to protect the display panel 10. The optical functional layer OFL may be attached on the cover window through an optically clear adhesive, or attached on the touchscreen layer TSL through an optically clear adhesive.

The panel-protecting layer PB may be attached under the substrate 100 to support and protect the substrate 100. The panel-protecting layer PB may include an opening PB_OP corresponding to the component area CA. The panel-protecting layer PB may improve light transmittance of the component area CA by including the opening PB_OP. The panel-protecting layer PB may include polyethylene terephthalate (PET) or polyimide (PI).

The area of the component area CA may be greater than an area in which the component 40 is arranged. Accordingly, the area of the opening PB_OP of the panel-protecting layer PB may not coincide with the area of the component area CA.

Figure 6:
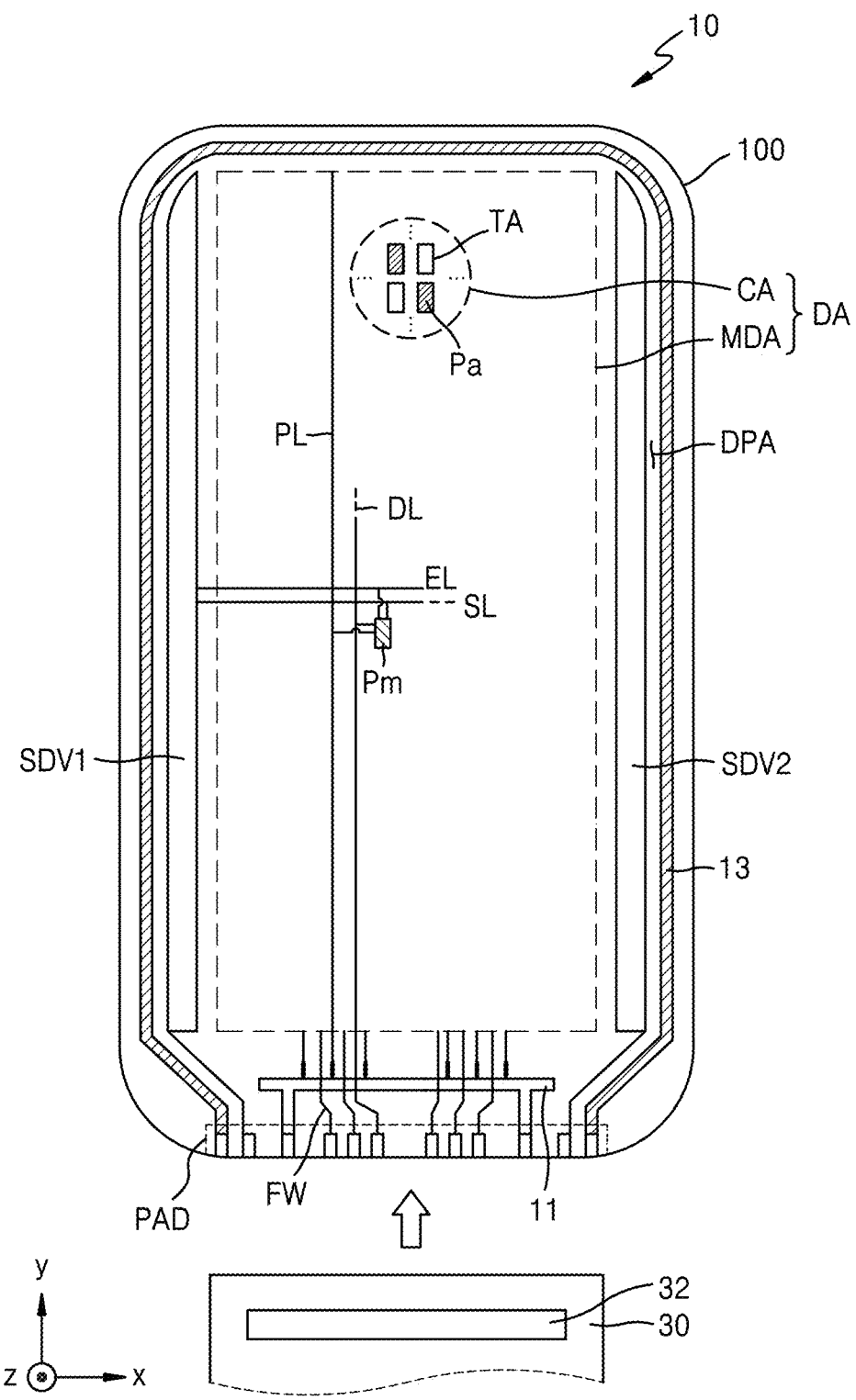
FIG. 6 is a plan view of a display panel according to an embodiment.

FIG. 6 is a plan view of the display panel 10 according to an embodiment.

Referring to FIG. 6, various kinds of elements constituting the display panel 10 are arranged on the substrate 100. The substrate 100 includes the display area DA and the peripheral area DPA surrounding the display area DA. The display area DA includes the main display area MDA and the component area CA. The main display area MDA may display a main image and the component area CA may include the transmission area TA and display an auxiliary image. The auxiliary image may form one entire image with the main image or may be an image independent of the main image.

A plurality of main sub-pixels Pm are arranged in the main display area MDA. Each of the main sub-pixels Pm may be implemented by a display element such as an organic light-emitting diode OLED. Each main sub-pixel Pm may emit, for example, red, green, blue, or white light. The main display area MDA may be covered by the encapsulation layer and thus protected from external air or moisture, etc.

The component area CA may be arranged on one side of the main display area MDA as described above or arranged inside the display area DA and surrounded by the main display area MDA. A plurality of auxiliary sub-pixels Pa are arranged in the component area CA. Each of the plurality of auxiliary sub-pixels Pa may be implemented by a display element such as an organic light-emitting diode OLED. Each auxiliary sub-pixel Pa may emit, for example, red, green, blue, or white light. The component area CA may be covered by the encapsulation layer and thus protected from external air or moisture, etc.

The component area CA may include the transmission areas TA. The transmission areas TA may surround the plurality of auxiliary sub-pixels Pa. Alternatively, the transmission areas TA and the plurality of auxiliary sub-pixels Pa may be arranged in a lattice configuration.

The component area CA includes the transmission area TA, and thus, a resolution of the component area CA may be lower than a resolution of the main display area MDA. As an example, the resolution of the component area CA may be about ½, ⅜, ⅓, ¼, 2/9, ⅛, 1/9, or 1/16 of the resolution of the main display area MDA. As an example, the resolution of the main display area MDA may be 400 ppi or more, and the resolution of the component area CA may be about 200 ppi or about 100 ppi.

Each of pixel circuits that drive the main sub-pixel Pm and the auxiliary sub-pixel Pa may be electrically connected to outer circuits arranged in the peripheral area DPA. A first scan driving circuit SDV1 and a second scan driving circuit SDV2, a terminal portion PAD, a driving voltage supply line 11, and a common voltage supply line 13 may be arranged in the peripheral area DPA.

The first scan driving circuit SDV1 may apply a scan signal to each of the pixel circuits that drive the sub-pixels, that is, the first scan driving circuit SDV1 may drive the main sub-pixel Pm and the auxiliary sub-pixel Pa through a scan line SL. The first scan driving circuit SDV1 may apply an emission control signal to each pixel circuit through an emission control line EL. The second scan driving circuit SDV2 may be located on opposite side of the first scan driving circuit SDV1 with the main display area MDA disposed therebetween, and approximately parallel to the first scan driving circuit SDV1. Some of the pixel circuits corresponding to the main sub-pixels Pm in the main display area MDA may be electrically connected to the first scan driving circuit SDV1, and the rest of the pixel circuits may be electrically connected to the second scan driving circuit SDV2. Some of the pixel circuits of the auxiliary pixels Pa in the component area CA may be electrically connected to the first scan driving circuit SDV1, and the rest of the pixel circuits may be electrically connected to the second scan driving circuit SDV2. The second scan driving circuit SDV2 may be omitted.

The terminal portion PAD may be arranged on one side of the substrate 100. The terminal portion PAD is not covered by an insulating layer and is exposed and connected to a display circuit board 30. A display driver 32 may be arranged on the display circuit board 30.

The display driver 32 may generate a control signal that is transferred to the first scan driving circuit SDV1 and the second scan driving circuit SDV2. The display driver 32 generates a data signal. The generated data signal may be transferred to the pixel circuits of the main and auxiliary sub-pixels Pm and Pa through a fan-out wiring FW and a data line DL connected to the fan-out wiring FW.

The display driver 32 may supply a driving voltage ELVDD to the driving voltage supply line 11 and supply a common voltage ELVSS to the common voltage supply line 13. The driving voltage ELVDD may be applied to the pixel circuits corresponding to the main and auxiliary sub-pixels Pm and Pa through a driving voltage line PL connected to the driving voltage supply line 11. The common voltage ELVSS may be applied to an opposite electrode of a display element through the common voltage supply line 13.

The driving voltage supply line 11 may be connected to the terminal portion PAD and may extend in an x-direction in the bottom portion of the main display area MDA. The common voltage supply line 13 may be connected to the terminal portion PAD and may have a loop shape including one open side to partially surround the main display area MDA.

Figure 7:
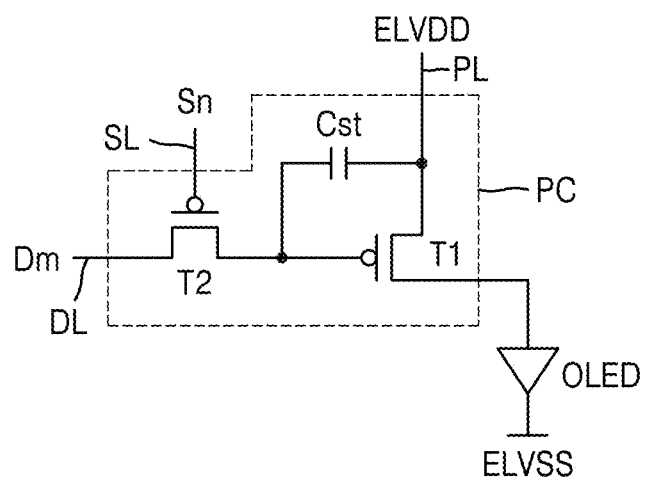
FIG. 7 is an equivalent circuit diagram of a pixel circuit that drives main and auxiliary sub-pixels, according to an embodiment.

FIG. 7 is an equivalent circuit diagram of a pixel circuit that drives the main and auxiliary sub-pixels Pm and Pa according to an embodiment.

Referring to FIG. 7, the pixel circuit PC may be connected to a light-emitting element to control light-emission of sub-pixels. A light-emitting element may be an organic light-emitting diode OLED. The pixel circuit PC includes a driving transistor T1, a switching transistor T2, and a capacitor Cst. The switching transistor T2 is connected to the scan line SL and the data line DL and transfers a data signal Dm to the driving transistor T1 in response to a scan signal Sn input through the scan line SL. The data signal Dm is input through the data line DL.

The capacitor Cst is connected to the switching transistor T2 and the driving voltage line PL and stores a voltage corresponding to a difference between a voltage transferred from the switching transistor T2 and the driving voltage ELVDD supplied to the driving voltage line PL.

The driving transistor T1 is connected between the driving voltage line PL and a light-emitting element ED and may control a driving current flowing from the driving voltage line PL to a light-emitting element ED according to the voltage stored in the capacitor Cst. The organic light-emitting diode OLED may emit light having a preset brightness according to the driving current.

Though FIG. 7 describes the case where the pixel circuit PC includes two thin-film transistors and one capacitor, the embodiment is not limited thereto. In another embodiment, the pixel circuit PC may include seven thin-film transistors and one storage capacitor. In another embodiment, the pixel circuit PC may include two or more storage capacitors.

In an embodiment, the pixel circuit that drives the main sub-pixel Pm and the pixel circuit that drives the auxiliary sub-pixel Pa may have different structures. As an example, the pixel circuit that drives the main sub-pixel Pm may include seven thin-film transistors and one or more storage capacitors, and the pixel circuit that drives the auxiliary sub-pixel Pa may include two thin-film transistors and one storage capacitor.

Figure 8A:
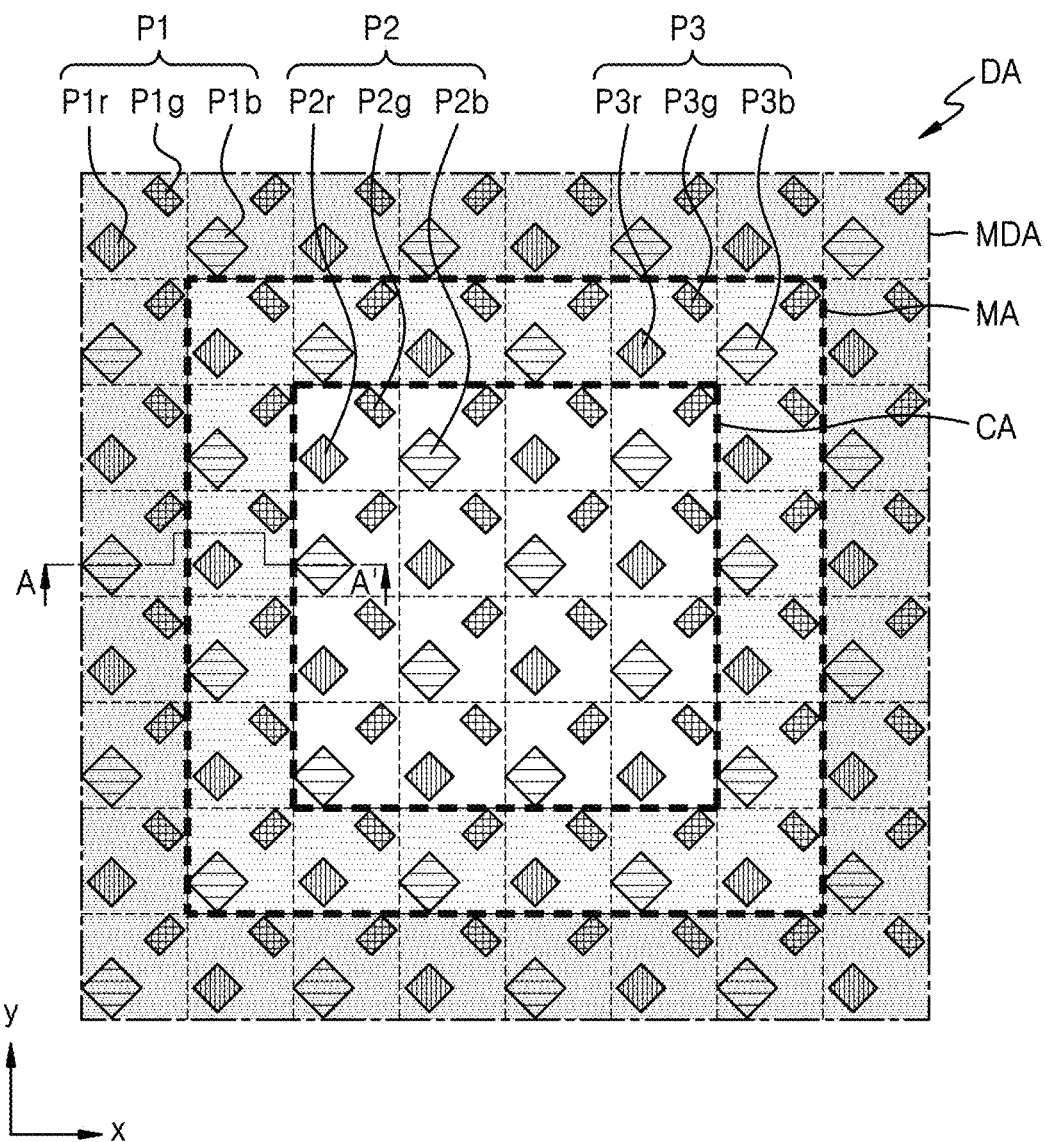
FIG. 8A is a plan view of a portion of a display area of a display panel according to an embodiment.
Figure 9A:
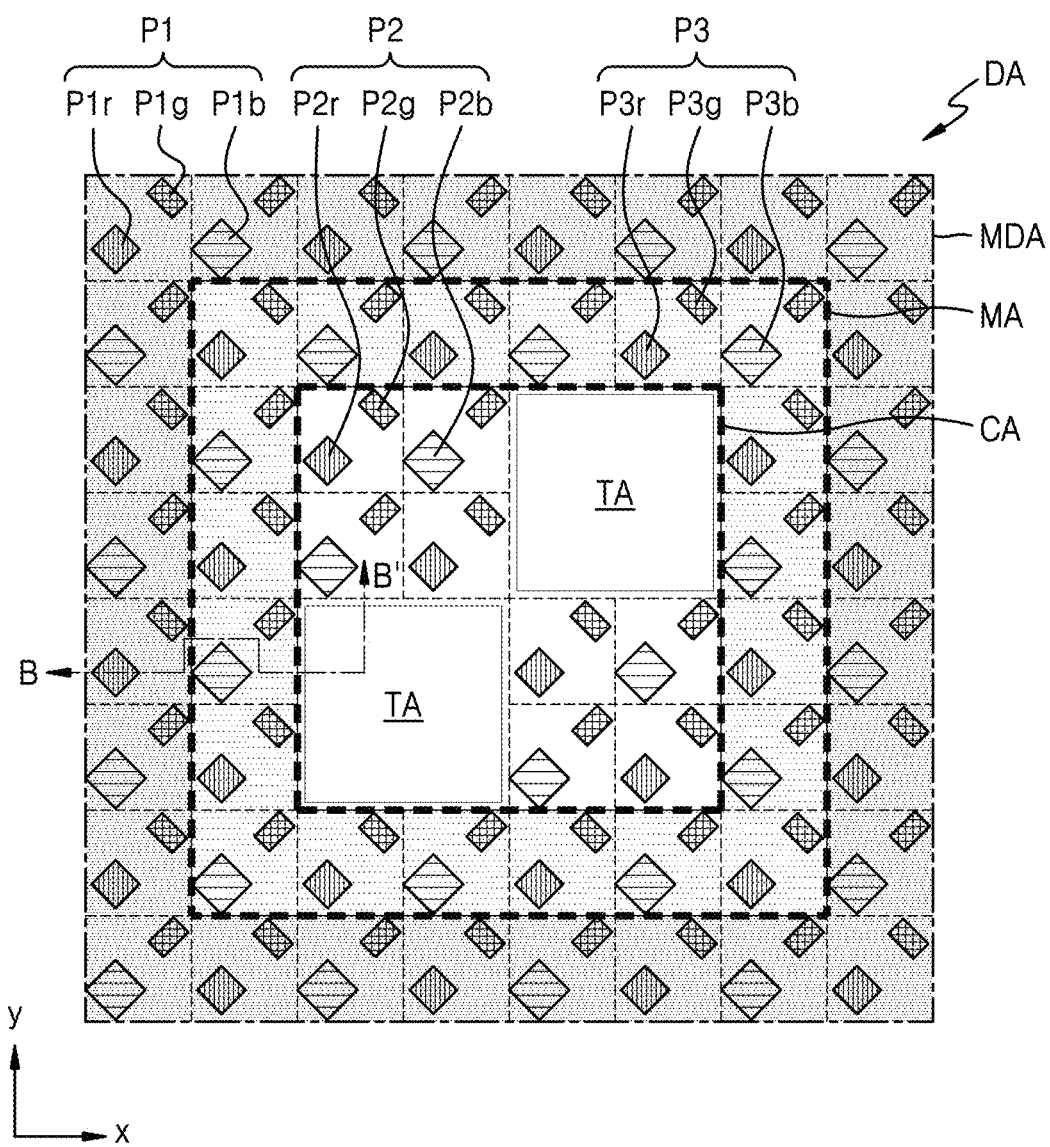
Figure 9B:
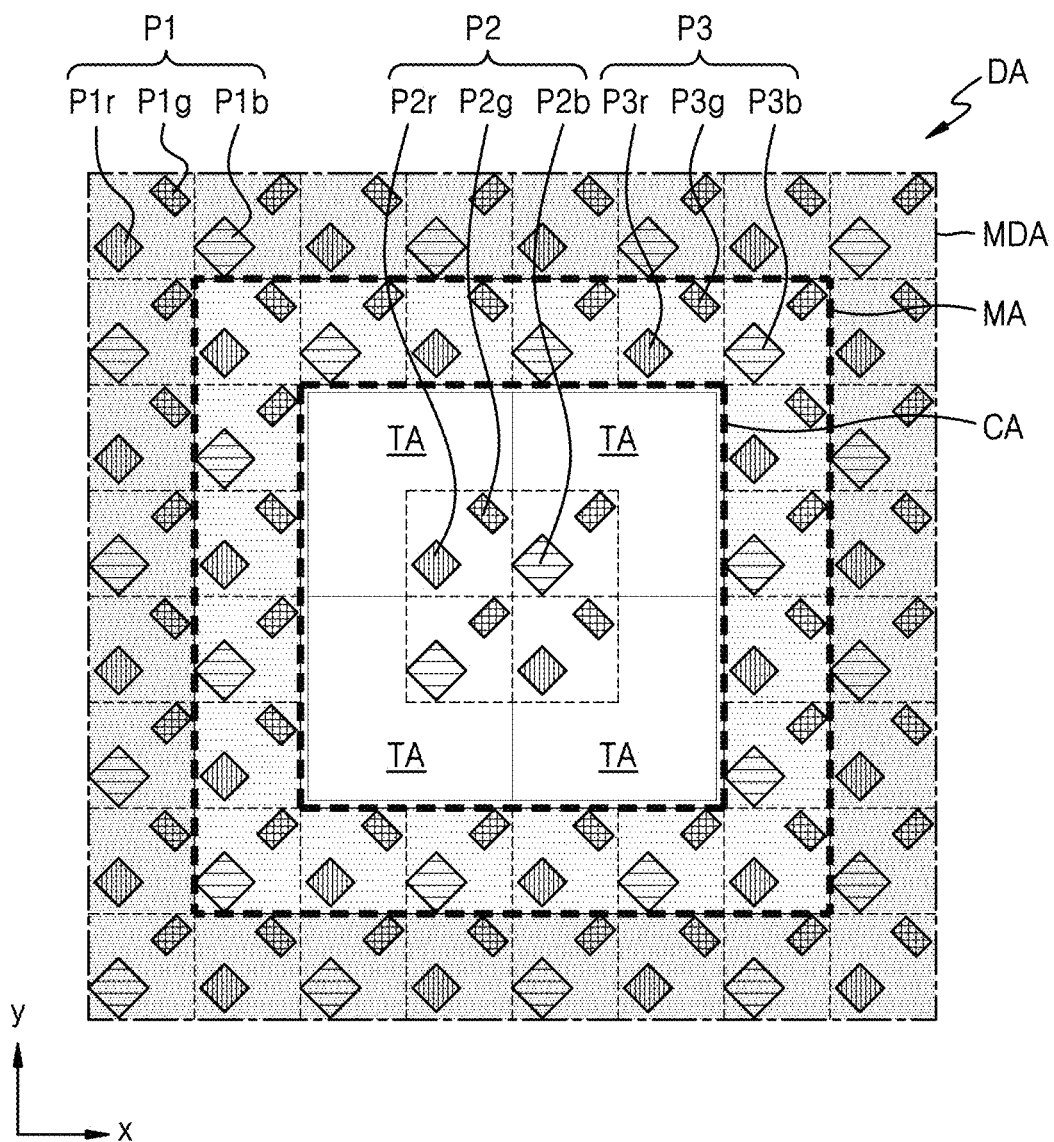

FIG. 8A is a plan view of a portion of the display area DA of the display panel 10 according to an embodiment, and FIGS. 9A and 9B are views of modifications of FIG. 8A.

Referring to FIG. 8A, first pixels P1 may be arranged in the main display area MDA. The first pixels P1 may include a red first pixel P1r, a green first pixel P1g, and a blue first pixel P1b. In an embodiment, as shown in FIG. 8A, a red first pixel P1r, a green first pixel P1g, and a blue first pixel P1b may be arranged in a pentile type. In another embodiment, a red first pixel P1r, a green first pixel P1g, and a blue first pixel P1b may be arranged in a stripe type.

A red first pixel P1r, a green first pixel P1g, and a blue first pixel P1b may have different sizes (or widths). As an example, a blue first pixel P1b may be greater than a red first pixel P1r and a green first pixel P1g, and a red first pixel P1r may be greater than a green first pixel P1g. In an embodiment, a blue first pixel P1b and a red first pixel P1r may have a rhombus shape. A green first pixel P1g may have a rectangular shape. Neighboring green first pixels P1g may extend in different directions.

Second pixels P2 may be arranged in the component area CA. The second pixels P2 may include a red second pixel P2r, a green second pixel P2g, and a blue second pixel P2b. Though it is shown in FIG. 8A that the second pixels P2 have the same configuration as the first pixels P1 in the main display area MDA, the embodiment is not limited thereto. In another embodiment, the second pixels P2 may have configuration different from the first pixels P1. As an example, the first pixels P1 may be arranged in a pentile configuration, and the second pixels P2 may be arranged in a stripe configuration, or a size of each of the second pixels P2 may be less than each of the first pixels P1.

Figure 19:
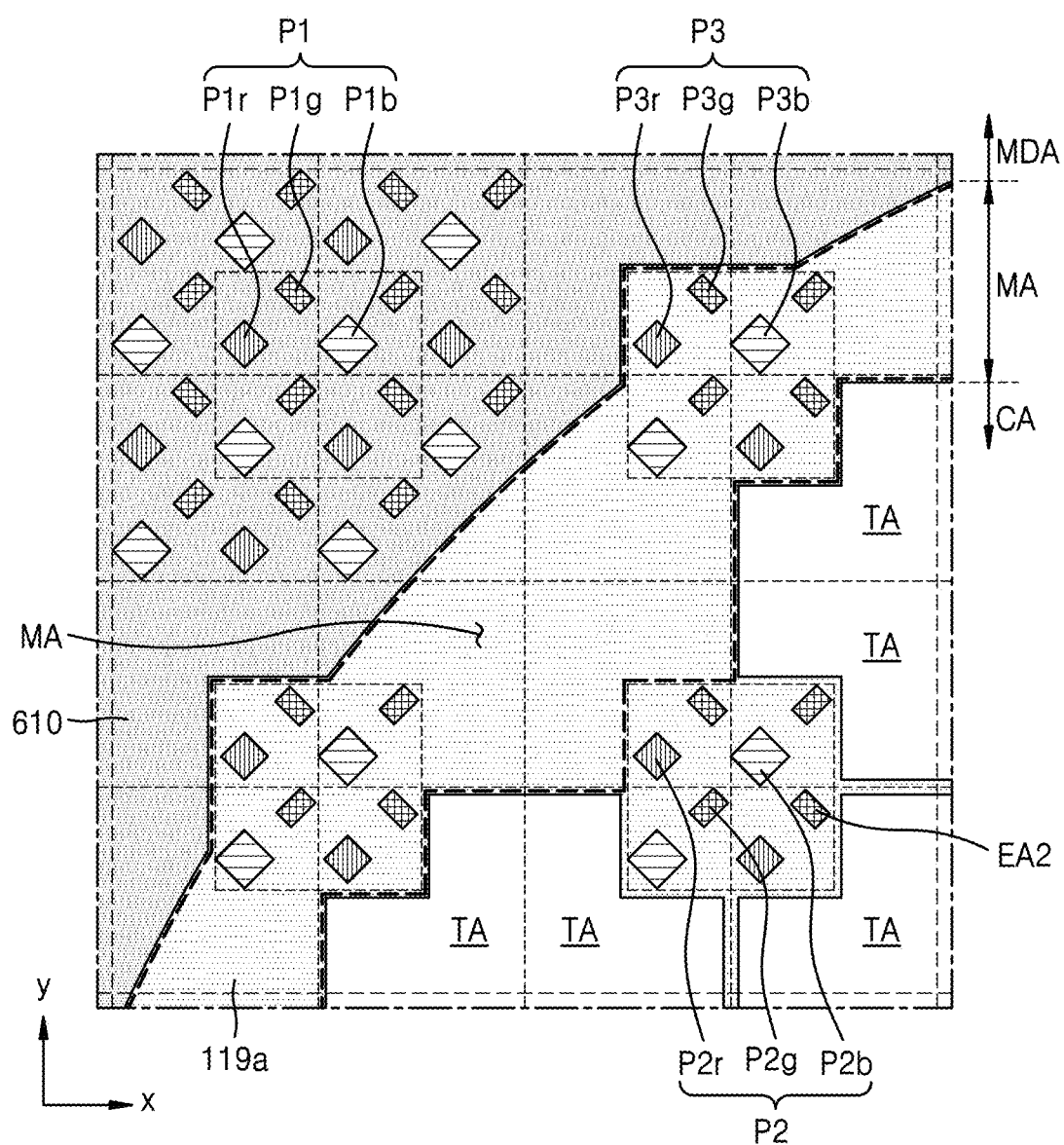
FIG. 19 is a plan view of a portion of a display area of a display panel according to an embodiment.

An intermediate area MA is a region arranged between the main display area MDA and the component area CA. Third pixels P3 may be arranged in the intermediate area MA. The third pixels P3 may include a red third pixel P3r, a green third pixel P3g, and a blue third pixel P3b. In another embodiment, pixels may not be arranged in the intermediate area MA as shown in FIG. 19 below. Though it is shown in FIG. 8A that the intermediate area MA is continuously arranged between the main display area MDA and the component area CA, the intermediate area MA may be discontinuously arranged between the main display area MDA and the component area CA.

As described in FIG. 10 and below, in the present embodiment, the main display area MDA may be a region in which a first insulating layer 119a overlaps a black matrix 610. The intermediate area MA may be a region in which the first insulating layer 119a does not overlap the black matrix 610. In other words, the intermediate area MA may be a region in which only one of the first insulating layer 119a and the black matrix 610 is arranged. The component area CA may be a region in which neither the first insulating layer 119a nor the black matrix 610 is arranged. Because the intermediate area MA includes either the first insulating layer 119a or the black matrix 610, a deterioration in an image sensed by the user due to a reflectivity difference between the main display area MDA and the component area CA may be more effectively reduced.

Figure 8B:
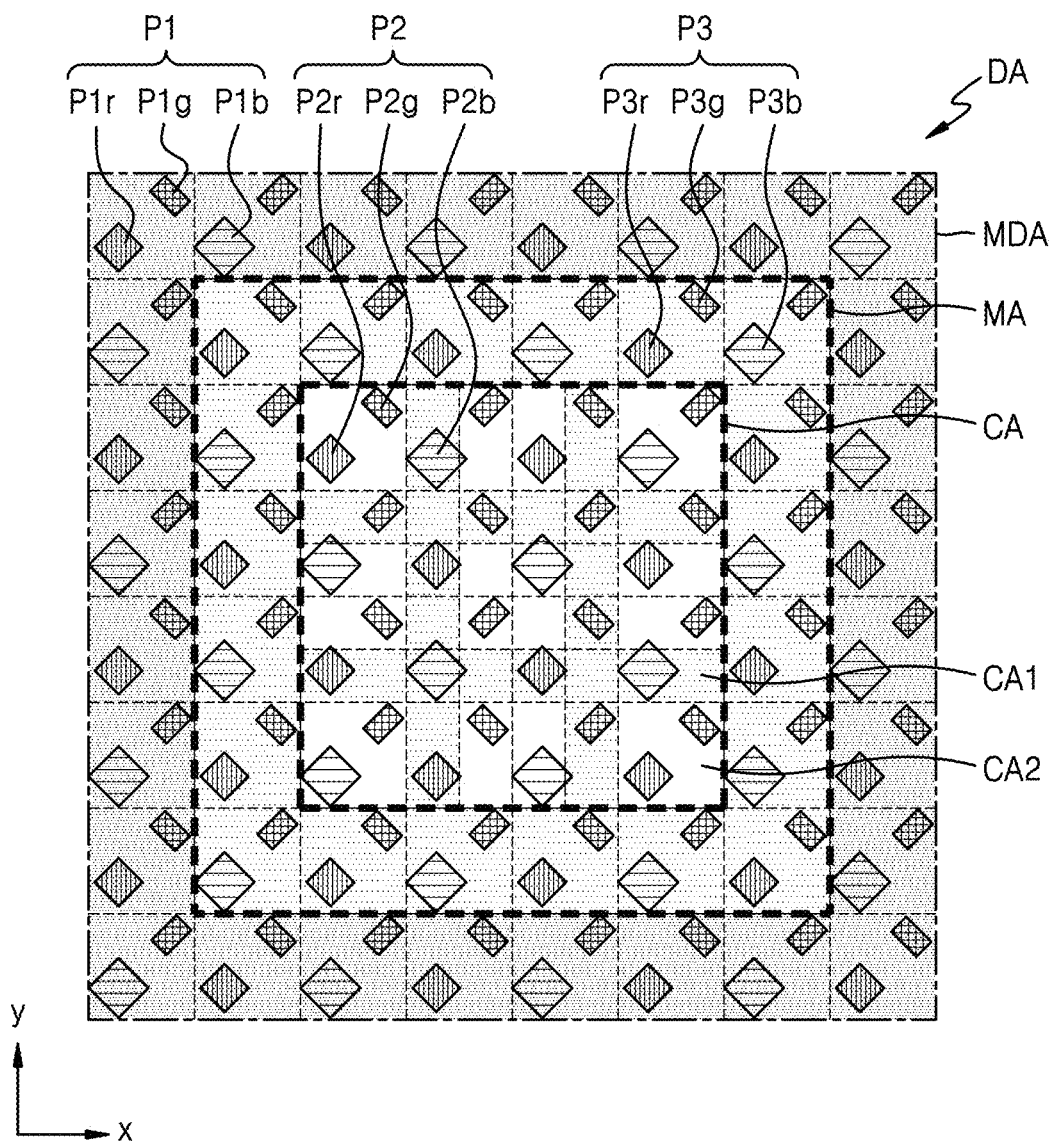
FIGS. 8B, 9A, and 9B are views of modifications of FIG. 8A.

In another embodiment, as shown in FIG. 8B, the first insulating layer 119a or the black matrix 610 is arranged to correspond to the component area CA. In the component area CA, the first insulating layer 119a may not overlap the black matrix 610, and as described in FIG. 10 and below, the first insulating layer 119a or the black matrix 610 may be arranged in the component area CA not to overlap each other in a plan view. A region of the component area CA in which the first insulating layer 119a or the black matrix 610 is arranged may be defined as a first component area CAL A region of the component area CA in which neither the first insulating layer 119a nor the black matrix 610 is arranged may be defined as a second component area CA2.

In the component area CA, though the first insulating layer 119a or the black matrix 610 may be arranged in a lattice configuration as shown in FIG. 8B, the embodiment is not limited thereto. The first insulating layer 119a or the black matrix 610 is arranged to correspond to a portion of the component area CA as described above, and thus, a deterioration in the image sensed by the user due to a reflectivity difference between the main display area MDA and the component area CA may be more effectively reduced.

FIGS. 9A and 9B show the case where the component area CA includes the transmission area TA. The transmission area TA may neighbor the second pixels P2. As an example, the transmission area TA may be arranged between the second pixels P2. As shown in FIG. 9A, the transmission areas TA may be arranged in an oblique direction with respect to an x-direction and a y-direction, or as shown in FIG. 9B, the transmission areas TA may be arranged to neighbor each other and surround the second pixels P2.

Though not shown in FIGS. 9A and 9B, the bottom metal layer BML (see FIG. 4) may be arranged in the component area CA and may include an opening. The shape of the transmission area TA may be defined by the opening in the bottom metal layer BML. In an embodiment, the opening may have an approximately quadrangular shape, an approximately circular shape, or an elliptical shape in a plan view. In an embodiment, the opening may have a cross shape. Various modifications may be made in the configuration of the opening in the bottom metal layer BML. In another embodiment, the bottom metal layer BML (see FIG. 4) may be partially arranged to correspond to the component area CA, and the transmission area TA may be defined by a transmission window formed through insulating layers of a multi-layer stacked on the substrate 100.

Figure 10:
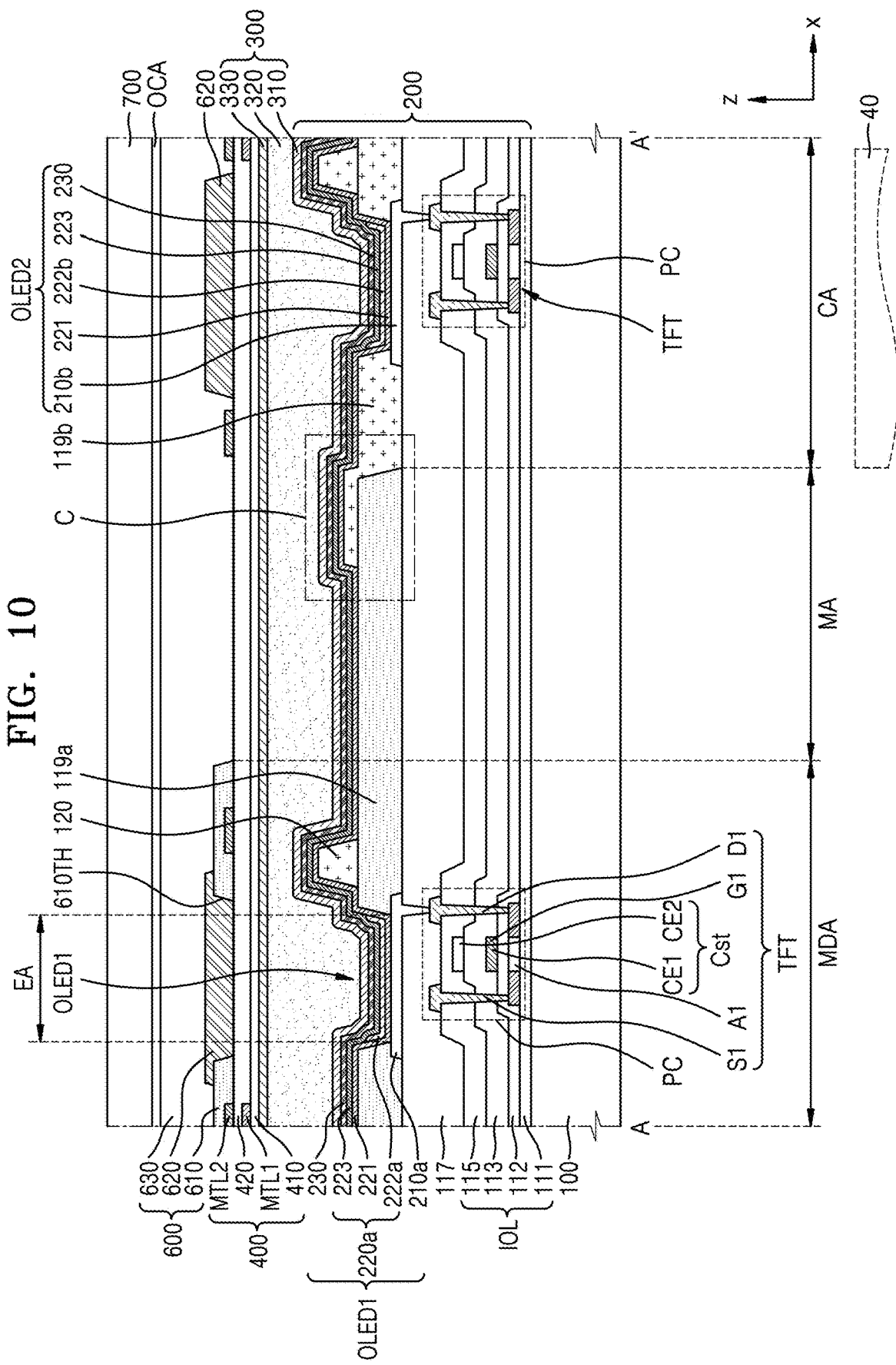
FIG. 10 is a cross-sectional view of a portion of a display panel of a display apparatus according to an embodiment.
Figure 11:
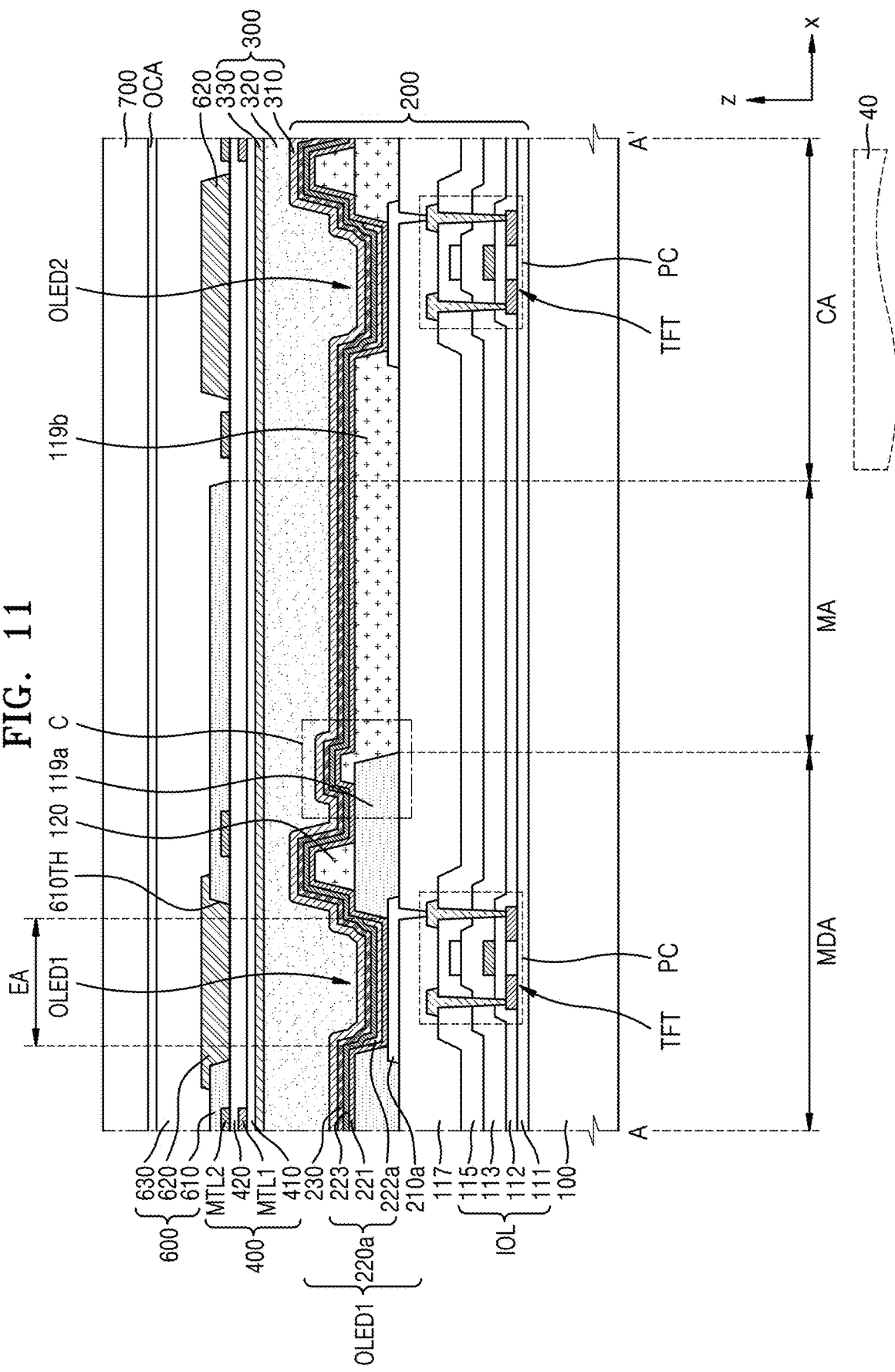
FIG. 11 is a view of a modification of FIG. 10.

FIG. 10 is a cross-sectional view of a portion of the display panel 10 of the display apparatus 1 according to an embodiment, and FIG. 11 is a view of a modification of FIG. 10. The display panel 10 of FIG. 10 may include a substrate 100, a display layer 200, and a thin-film encapsulation layer 300.

Referring to FIG. 10, the substrate 100 may include an insulating material such as glass, quartz, and a polymer resin. The substrate 100 may be a rigid substrate or a flexible substrate that is bendable, foldable, and rollable.

In an embodiment, the substrate 100 may have a multi-layered structure. The substrate 100 may include at least one base layer and at least one inorganic layer that are sequentially and alternately stacked. The at least one base layer may include a polymer resin. The polymer resin may include polyethersulfone, polyacrylate, polyetherimide, polyethylene naphthalate, polyethylene terephthalate, polyphenylene sulfide, polyarylate, polyimide, polycarbonate, or cellulose acetate propionate. The inorganic layer is a barrier layer configured to prevent the penetration of external foreign substances and may include a single layer or a multi-layer including an inorganic insulating material such as silicon nitride, silicon oxynitride, and/or silicon oxide.

The buffer layer 111 may reduce or block the penetration of foreign substance, moisture, or external air from below the substrate 100 and provide a flat surface on the substrate 100. The buffer layer 111 may include an inorganic insulating material such as silicon oxide, silicon oxynitride, and silicon nitride, and may have a single-layered or multi-layered structure including the above materials.

A pixel circuit PC may be arranged on the buffer layer 111, the pixel circuit PC including a thin-film transistor TFT and a storage capacitor Cst. The thin-film transistor TFT may include a semiconductor layer A1, a gate electrode G1, a source electrode S1, and a drain electrode Dl. The gate electrode G1 may overlap a channel region of the semiconductor layer A1, and the source electrode S1 and the drain electrode D1 may be respectively connected to a source region and a drain region of the semiconductor layer A1. A gate insulating layer 112 may be arranged between the semiconductor layer A1 and the gate electrode G1. A first interlayer insulating layer 113 and a second interlayer insulating layer 115 may be arranged between the gate electrode G1 and the source electrode S1, or between the gate electrode G1 and the drain electrode Dl.

The storage capacitor Cst may overlap the thin-film transistor TFT. The storage capacitor Cst may include a first capacitor plate CE1 and a second capacitor plate CE2 overlapping each other. In an embodiment, the gate electrode G1 of the thin-film transistor TFT may be the first capacitor plate CE1 of the storage capacitor Cst. The first interlayer insulating layer 113 may be arranged between the first capacitor plate CE1 and the second capacitor plate CE2.

The semiconductor layer A1 may include polycrystalline silicon. In an embodiment, the semiconductor layer A1 may include amorphous silicon. In an embodiment, the semiconductor layer A1 may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The semiconductor layer A1 may include a channel region, a source region, and a drain region, the source region and the drain region being doped with impurities.

The gate insulating layer 112 may include an inorganic insulating material such as silicon oxide, silicon oxynitride, and silicon nitride, and may have a single-layered or multi-layered structure including the above materials.

The gate electrode G1 or the first capacitor plate CE1 may include a low-resistance conductive material such as molybdenum (Mo), aluminum (Al), copper (Cu), and titanium (Ti), and have a single-layered or multi-layered structure including the above materials.

The first interlayer insulating layer 113 may include an inorganic insulating material such as silicon oxide, silicon oxynitride, and silicon nitride, and may have a single-layered or multi-layered structure including the above materials.

The second capacitor plate CE2 may include a single layer or a multi-layer including aluminum (Al), platinum (Pt), palladium (Pd), silver (Ag), magnesium (Mg), gold (Au), nickel (Ni), neodymium (Nd), iridium (Jr), chrome (Cr), calcium (Ca), molybdenum (Mo), titanium (Ti), tungsten (W), and/or copper (Cu).

The second interlayer insulating layer 115 may include an inorganic insulating material such as silicon oxide, silicon oxynitride, and silicon nitride, and may have a single-layered or multi-layered structure including the above materials.

The source electrode Si or the drain electrode D1 may include a single layer or a multi-layer including aluminum (Al), platinum (Pt), palladium (Pd), silver (Ag), magnesium (Mg), gold (Au), nickel (Ni), neodymium (Nd), iridium (Jr), chrome (Cr), calcium (Ca), molybdenum (Mo), titanium (Ti), tungsten (W), and/or copper (Cu). As an example, the source electrode Si or the drain electrode D1 may include a three-layered structure of titanium layer/aluminum layer/titanium layer.

A planarization insulating layer 117 may include a material different from those of at least one inorganic insulating layer disposed thereunder, for example, the gate insulating layer 112, the first interlayer insulating layer 113, and the second interlayer insulating layer 115. The planarization insulating layer 117 may include an organic insulating material such as acryl, benzocyclobutene (BCB), polyimide, or hexamethyldisiloxane (HMDSO).

A first pixel electrode 210a may be formed on the planarization insulating layer 117 to correspond to the main display area MDA. The first pixel electrode 210a may be electrically connected to the pixel circuit PC disposed therebelow through a contact hole formed in the planarization insulating layer 117.

The first pixel electrode 210a may include a reflective layer including silver (Ag), magnesium (Mg), aluminum (Al), platinum (Pt), palladium (Pd), gold (Au), nickel (Ni), neodymium (Nd), iridium (Jr), chrome (Cr), or a compound thereof. The first pixel electrode 210a may include a reflective layer and a transparent conductive layer disposed on and/or under the reflective layer. The reflective layer may include the material described hereabove. The transparent conductive layer may include indium tin oxide (ITO), indium zinc oxide (IZO), zinc oxide (ZnO), indium oxide ($In_2O_3$), indium gallium oxide (IGO), or aluminum zinc oxide (AZO). In an embodiment, the first pixel electrode 210a may have a three-layered structure of ITO layer/Ag layer/ITO layer.

The first insulating layer 119a may cover edges of the first pixel electrode 210a and include a first opening OP1 exposing the central portion of the first pixel electrode 210a. In the present embodiment, the first insulating layer 119a may include a light-blocking material and an organic insulating material such as BCB, polyimide, or HMDSO. Accordingly, the first insulating layer 119a may serve as an opaque layer, that is, a non-light-transmissive layer. As an example, the light-blocking material may include colored pigment, for example, pigment of white, black, or another color, or include a polyimide (PI)-based binder and pigment in which red and green are mixed, or include a cardo-based binder resin and a mixture of lactam black pigment and blue pigment. Alternatively, the light-blocking material may include carbon black.

The first opening OP1 of the first insulating layer 119a may define an emission area EA. Red, green, or blue light may be emitted through the emission area EA. The area or width of the emission area EA may define the area or width of a pixel.

A spacer 120 may be formed on the first insulating layer 119a. The spacer 120 may prevent the damage to layers under the spacer 120 due to a mask during a process of forming an intermediate layer 222, etc. The spacer 120 may include an organic insulating material such as BCB, polyimide, or HMDSO and include a light-transmissive material.

The intermediate layer 222 may include a first emission layer 222a overlapping the first pixel electrode 210a. The first emission layer 222a may include an organic material. The first emission layer 222a may include a polymer organic material or a low molecular weight organic material emitting light having a preset color. The first emission layer 222a may be formed through a deposition process that uses a mask as described above.

A first functional layer 221 and a second functional layer 223 may be arranged under and/or on the first emission layer 222a.

The first functional layer 221 may include a single layer or a multi-layer. For example, in the case where the first functional layer 221 includes a polymer material, the first functional layer 221 may include a hole transport layer (HTL) which has a single-layered structure, and include poly(3,4-ethylenedioxythiophene) (PEDOT) or polyaniline (PANI). In the case where the first functional layer 221 includes a low molecular weight material, the first functional layer 221 may include a hole injection layer (HIL) and a hole transport layer (HTL).

The second functional layer 223 may be omitted. For example, in the case where the first functional layer 221 and the emission layer 222a include a polymer material, the second functional layer 223 may be preferably formed. The second functional layer 223 may include a single layer or a multi-layer. The second functional layer 223 may include an electron transport layer (ETL) and/or an electron injection layer (EIL).

The first functional layer 221 and the second functional layer 223 may each be provided as one body to entirely cover the display area DA. As shown in FIG. 10, the first functional layer 221 and the second functional layer 223 may be provided as one body over the display area DA.

An opposite electrode 230 may include a conductive material having a relatively low work function. As an example, the opposite electrode 230 may include a (semi) transparent layer including silver (Ag), magnesium (Mg), aluminum (Al), nickel (Ni), chrome (Cr), lithium (Li), calcium (Ca), or an alloy thereof. Alternatively, the opposite electrode 230 may further include a layer on the (semi) transparent layer including the above material, the layer including ITO, IZO, ZnO, or In$_2$O$_3$. In an embodiment, the opposite electrode 230 may include silver (Ag) and magnesium (Mg). The opposite electrode 230 may be provided as one body over the display area DA.

A stack structure of the first pixel electrode 210a, the first intermediate layer 220a, and the opposite electrode 230 that are sequentially stack may constitute a light-emitting diode, for example, a first organic light-emitting diode OLED1.

The display layer that includes the pixel circuit PC, insulating layers, and the first organic light-emitting diode OLED1200 may be covered by the thin-film encapsulation layer 300.

The thin-film encapsulation layer 300 may include the first and second inorganic encapsulation layers 310 and 330 and the organic encapsulation layer 320 disposed therebetween.

The first and second inorganic encapsulation layers 310 and 330 may each include at least one inorganic insulating material. The inorganic insulating material may include aluminum oxide, titanium oxide, tantalum oxide, hafnium oxide, zinc oxide, silicon oxide, silicon nitride, and/or silicon oxynitride. The first and second inorganic encapsulation layers 310 and 330 may be formed through chemical vapor deposition.

The organic encapsulation layer 320 may include a polymer-based material. The polymer-based material may include an acryl-based resin, an epoxy-based resin, polyimide, and polyethylene. For example, the organic encapsulation layer 320 may include an acrylic resin, for example, polymethylmethacrylate, poly acrylic acid, etc. The organic encapsulation layer 320 may be formed by hardening a monomer or coating a polymer.

An input-sensing layer 400 may be arranged on the thin-film encapsulation layer 300. The input-sensing layer 400 may include a first conductive layer MTL1 and a second conductive layer MTL2 each including a sensing electrode and/or trace lines. A first insulating film 410 may be arranged between the thin-film encapsulation layer 300 and the first conductive layer MTL1. A second insulating film 430 may be arranged between the first conductive layer MTL1 and the second conductive layer MT2.

The first conductive layer MTL1 and the second conductive layer MT2 may include a conductive material. The conductive material may include molybdenum (Mo), aluminum (Al), copper (Cu), and titanium (Ti), and include a single layer or a multi-layer including the above materials. In an embodiment, the first conductive layer MTL1 and the second conductive layer MT2 may have a structure of Ti/Al/Ti in which a titanium layer, an aluminum layer, and a titanium layer are sequentially stacked.

The first insulating film 410 and the second insulating film 430 may include an inorganic insulating material and/or an organic insulating material. The inorganic insulating material may include silicon oxide, silicon oxynitride, and/or silicon nitride. The organic insulating material may include an acryl-based organic material and an imide-based organic material.

A filter plate 600 as an optical functional layer may be arranged on the input-sensing layer 400. The filter plate 600 may include the black matrix 610, the color filter 620, and the overcoat layer 630.

The black matrix 610 is arranged in a non-display area around the emission area EA and may surround the emission area EA. In an embodiment, the black matrix 610 may passivate the touch electrode of the input-sensing layer 400. As an example, as shown in FIG. 10, the second conductive layer MTL2 of the input-sensing layer 400 may overlap the black matrix 610 and be covered by the black matrix 610. The black matrix 610 may include an insulating material (e.g. an organic insulating material) including pigment or dye having a black color. The black matrix 610 may include a material that may be included in the first insulating layer 119a.

The black matrix 610 may include a through hole 610TH in an area corresponding to the emission area EA. The through hole 610TH may be the same as or greater than the first opening OP1 of the first insulating layer 119a that defines the emission area EA.

The color filter 620 may be arranged in the emission areas EA of the first and second organic light-emitting diodes OLED1 and OLED2. The color filter 620 may include red, green, or blue pigment or dye depending on the color of light emitted from the organic light-emitting diode OLED.

The overcoat layer 630 may be arranged on the black matrix 610 and the color filter 620 to planarize a top surface by covering the black matrix 610 and the color filter 620.

A cover window 700 may be arranged on an uppermost layer of the filter plate 600 with an adhesive layer such as an optically clear adhesive OCA interposed therebetween.

Similar to the above, the second organic light-emitting diode OLED2 may be arranged also in the component area CA. The second organic light-emitting diode OLED2 may include a second pixel electrode 210b, a second intermediate layer 220b, and the opposite electrode 230. The second intermediate layer 220b may include a second emission layer 222b. The second organic light-emitting diode OLED2 may be electrically connected to the pixel circuit PC disposed therebelow.

A second insulating layer 119b may cover edges of the second pixel electrode 210b and include a second opening OP2 exposing the central portion of the second pixel electrode 210b. In the present embodiment, the second insulating layer 119b may include a transparent or semi-transparent light-transmissive material. As an example, the second insulating layer 119b may include an organic insulating material such as BCB, polyimide, or HMDSO. In an embodiment, the second insulating layer 119b may include the same material as a spacer 120.

In the present embodiment, the first insulating layer 119a may extend from the main display area MDA to the component area CA and be arranged in the main display area MDA and the intermediate area MA. The first insulating layer 119a may not be disposed in the component area CA.

As described above, the first insulating layer 119a includes a light-blocking material, and thus, reflectivity of external light may be reduced.

The black matrix 610 may be arranged to correspond to the main display area MDA. In an embodiment, the black matrix 610 may not be arranged in the intermediate area MA. Accordingly, only the first insulating layer 119a from among the first insulating layer 119a and the black matrix 610 may be arranged in the intermediate area MA.

The second insulating layer 119b may be arranged in the component area CA. Like the first insulating layer 119a, the second insulating layer 119b serves as a pixel-defining layer. Unlike the first insulating layer 119a, the second insulating layer 119b may include a transparent insulating material. This is because the component 40 is arranged below the display panel 10 in an area corresponding to the component area CA and external light is required for the component 40 to operate. In an embodiment, in the case where the component 40 is a proximity sensor and/or an illuminance sensor, light corresponding to a wavelength of visible light is required for the component 40 to operate. In the component area CA, external light may pass through the second insulating layer 119b including a transparent insulating material and be received by the component 40. To this end, the black matrix 610 may not be arranged in the component area CA.

As described above, the first insulating layer 119a and the black matrix 610 include a light-blocking material to reduce reflectivity of external light. In a conventional display apparatus in which the intermediate area MA is not provided between the main display area MDA and the component area CA, and thus the main display area MDA directly contacts the component area CA, because both the first insulating layer 119a and the black matrix 610 are not arranged in the component area CA, an external light reflectivity is abruptly changed at the border between the main display area MDA and the component area CA. The abrupt change in reflectivity at the border between the main display area MDA and the component area CA may be seen by the user and this phenomenon becomes severe when the display apparatus 1 is turned off.

In contrast, in the display apparatus 1 according to an embodiment, the intermediate area MA which has reflectivity between that of the main display area MDA and that of the component area CA is arranged between the main display area MDA and the component area CA, the abrupt change in reflectivity at the border between the main display area MDA and the component area CA may be prevented from recognized by the user. The first insulating layer 119a or the black matrix 610 is arranged in the intermediate area MA, and thus, the intermediate area MA has reflectivity between the reflectivity of the main display area MDA and the reflectivity of the component area CA. Accordingly, boundary lines between the two areas may not be seen by the user. As an example, in the case where the reflectivity of the main display area MDA is about 5%, the reflectivity of the component area CA may be about 12% to about 13%, and the reflectivity of the intermediate area MA may be about 8%, which is an intermediate value thereof.

The display panel of FIG. 11 is mostly similar to that of FIG. 10 but is different from that of FIG. 10 in the configuration of the intermediate area MA. The rest of the configurations are the same as that of FIG. 10, and thus, differences are mainly described below.

Referring to FIG. 11, the first insulating layer 119a may not be disposed in the intermediate area MA but the black matrix 610 may be disposed in the intermediate area MA.

That is, the first insulating layer 119a may be arranged in only the main display area MA, and the black matrix 610 may extend from the main display area MDA to the intermediate area MA to overlap the intermediate area MA. As a result, only one of the first insulating layer 119a and the black matrix 610 each including a light-blocking material is disposed in the intermediate area MA, and the other of the first insulating layer 119a and the black matrix 610 is not disposed in the intermediate area MA. Thus, the intermediate area MA has higher reflectivity than the main display area MDA in which the first insulating layer 119a overlaps the black matrix 610. Accordingly, boundaries between the main display area MDA and the component area CA may not be seen by the user. Through this configuration, the user may not recognize a difference in an image between the main display area MDA and the component area CA.

Figure 12:
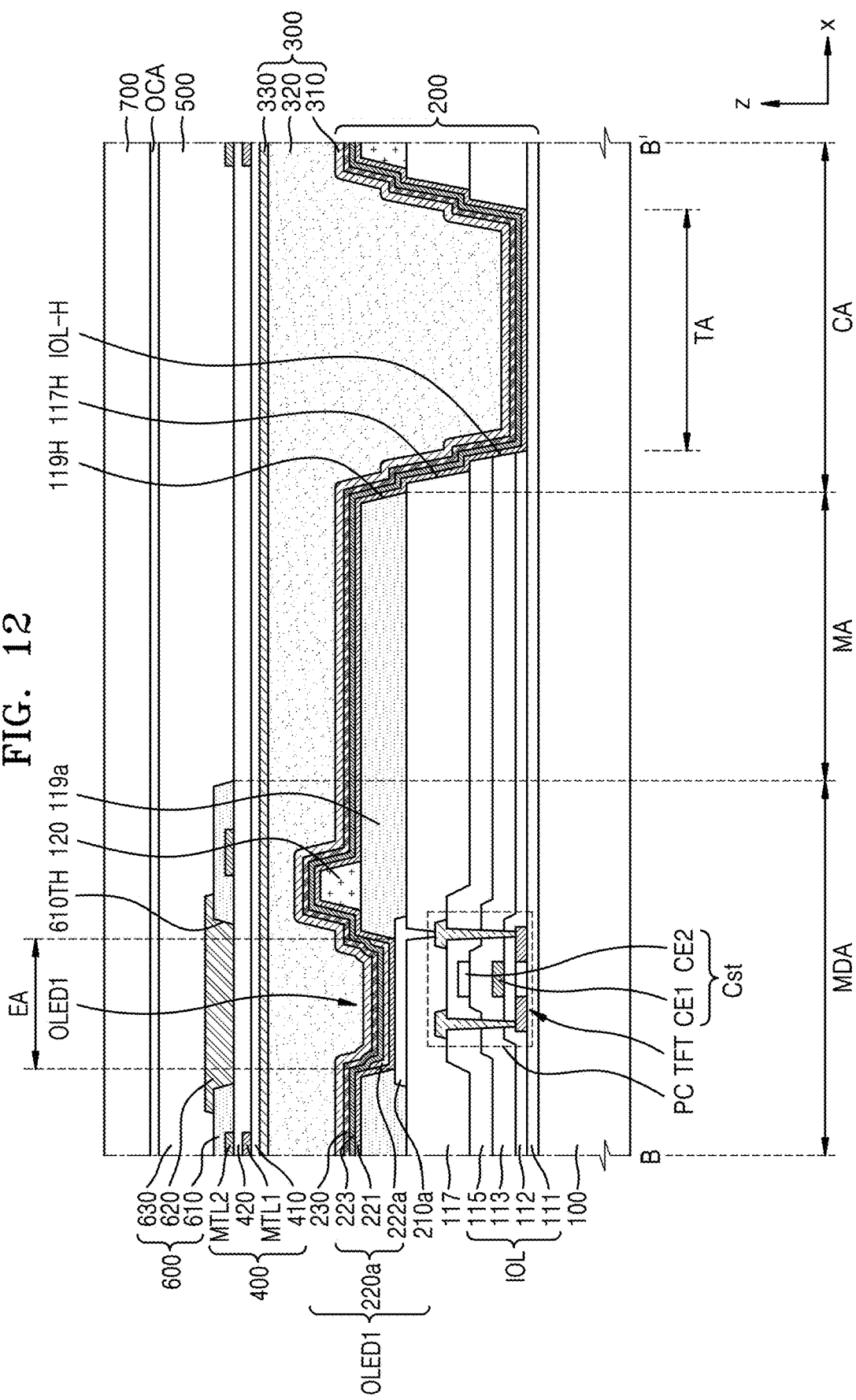
FIG. 12 is a cross-sectional view of a portion of a display panel of a display apparatus according to an embodiment.
Figure 13:
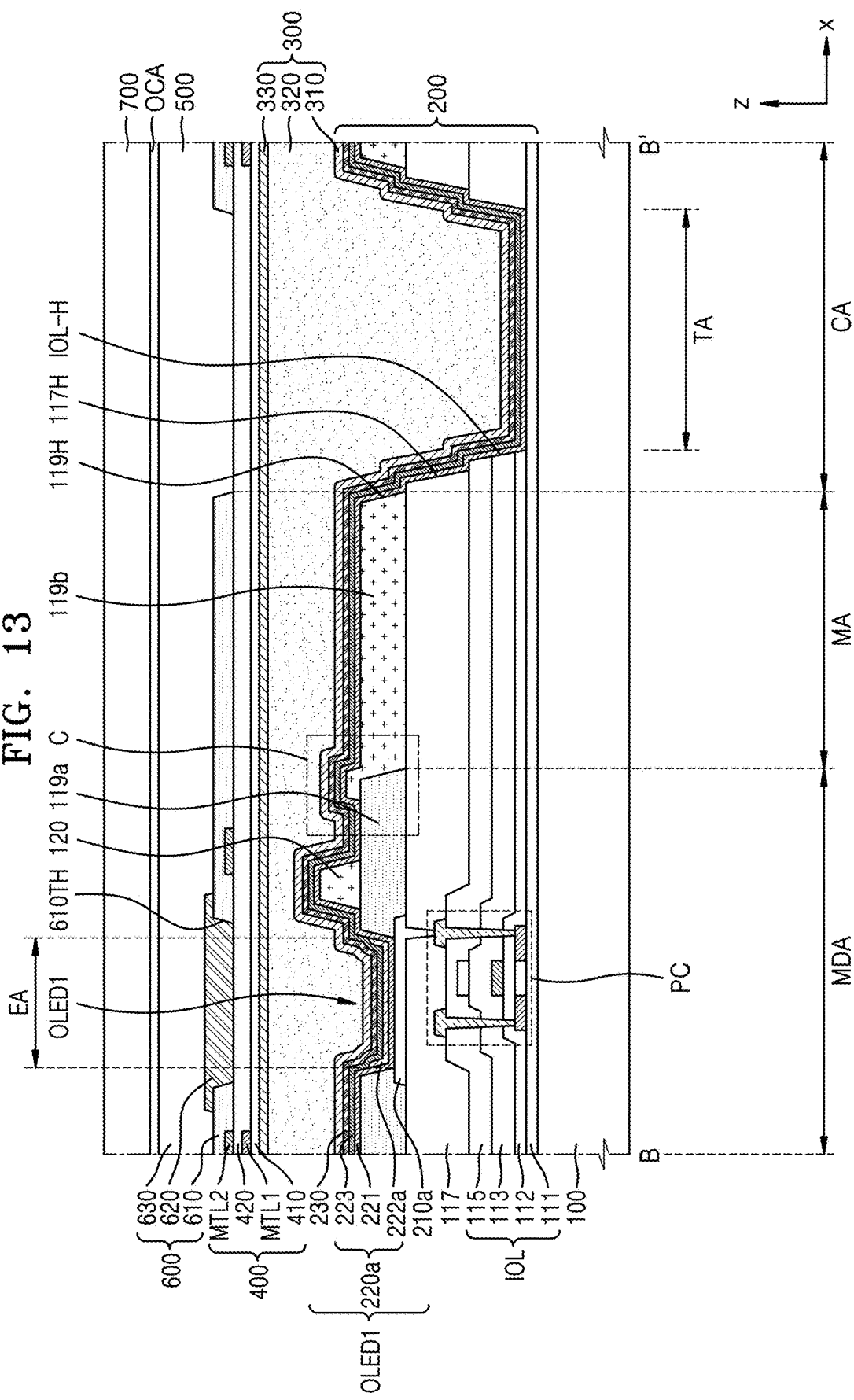
FIG. 13 is a view of a modification of FIG. 12.

FIG. 12 is a cross-sectional view of a portion of the display panel 10 of the display apparatus 1 according to an embodiment, and FIG. 13 is a view of a modification of FIG. 12.

FIGS. 12 and 13 are similar to FIGS. 10 and 11 but are different from FIGS. 10 and 11 in that the component area CA has the transmission area TA as shown in FIG. 9A or 9B. The display panel 10 of FIGS. 12 and 13 has the transmission area TA inside the component area CA, and thus, a light transmittance of the component area CA may be improved even more. In an embodiment, the component 40 arranged below the display panel 10 of FIGS. 12 and 13 may be a camera.

Insulating layers on the substrate 100, for example, at least one inorganic insulating layer IOL, the planarization insulating layer 117, and the second insulating layer 119b may each include a hole in an area corresponding to the transmission area TA. The hole may be a transmission window. The at least one inorganic insulating layer IOL may include at least one of the gate insulating layer 112, the first interlayer insulating layer 113, and the second interlayer insulating layer 115.

A first hole IOL-H in the at least one inorganic insulating layer IOL, a second hoe 117H in the planarization insulating layer 117, and a third hole 119H in a pixel-defining layer 119 may overlap one another in the transmission area TA. The opposite electrode 230 may also include a fourth hole arranged in the transmission area TA, and the fourth hole may overlap the first hole IOL-H, the second hole 117H, and the third hole 119H. The first hole IOL-H may be a through-hole formed through the gate insulating layer 112, the first interlayer insulating layer 113, and the second interlayer insulating layer 115. The second hole 117H and the third hole 119H may each be a through-hole.

Some of the insulating layers, for example, the buffer layer 111 may not include a hole arranged in the transmission area TA. As an example, as shown in FIG. 12, the buffer layer 111 may cover the transmission area TA. In another embodiment, the buffer layer 111 may include a hole arranged in the transmission area TA. In this case, a barrier layer (not shown) may be further arranged under the buffer layer 111. The barrier layer may prevent moisture transmission and including an inorganic layer.

The sizes or widths of the first hole IOL-H, the second hole 117H, and the third hole 119H may be different from one another. The first hole IOL-H, the second hole 117H, and the third hole 119H may be formed using a single mask. For example, the first hole IOL-H, the second hole 117H, and the third hole 119H may be formed simultaneously when forming the first insulating layer 119a pattern.

Though not shown, the second pixel P2 may neighbor the transmission area TA of FIG. 12.

Referring to FIG. 12, the first insulating layer 119a may extend from the main display area MDA to the component area CA and be arranged in the main display area MDA and the intermediate area MA. The black matrix 610 may be arranged to correspond to the main display area MDA. In an embodiment, the black matrix 610 may not be arranged in the intermediate area MA. Accordingly, only the first insulating layer 119a may be arranged in the intermediate area MA. The second insulating layer 119b may be arranged in the component area CA. Unlike the first insulating layer 119a, the second insulating layer 119b may include a transparent insulating material.

In a conventional display apparatus, the first insulating layer 119a and the black matrix 610 each include a light-blocking material, and thus, external light reflectivity in the main display area MDA may be less than external light reflectivity in the component area CA. A reflectivity difference between the main display area MDA and the component area CA may be large because the first insulating layer 119a overlaps the black matrix 610 in the main display area MDA, and both the first insulating layer 119a and the black matrix 610 are not arranged in the component area CA.

In contrast, in the display apparatus 1 according to an embodiment, the intermediate area MA is arranged between the main display area MDA and the component area CA. Accordingly, the abrupt change in reflectivity at the border between the main display area MDA and the component area CA may be prevented from recognized by the user.

Referring to FIG. 13, the first insulating layer 119a is not disposed in the intermediate area MA, and only the black matrix 610 may be arranged in the intermediate area MA. That is, the first insulating layer 119a is arranged only in the main display area MDA, and the black matrix 610 may extend from the main display area MDA to the intermediate area MA. As a result, only one of the first insulating layer 119a and the black matrix 610 each including a light-blocking material may be arranged in the intermediate area MA. Accordingly, the intermediate area MA has a higher external light reflectivity than the main display area MDA in which the first insulating layer 119a overlaps the black matrix 610, and has a lower external light reflectivity than the component area CA, and thus, boundary lines between the main display area MDA and the component area CA may not be recognized by the user. Though this configuration, a deterioration in an image sensed by the user due to reflectivity difference between the main display area MDA and the component area CA may be prevented.

Figure 14A:
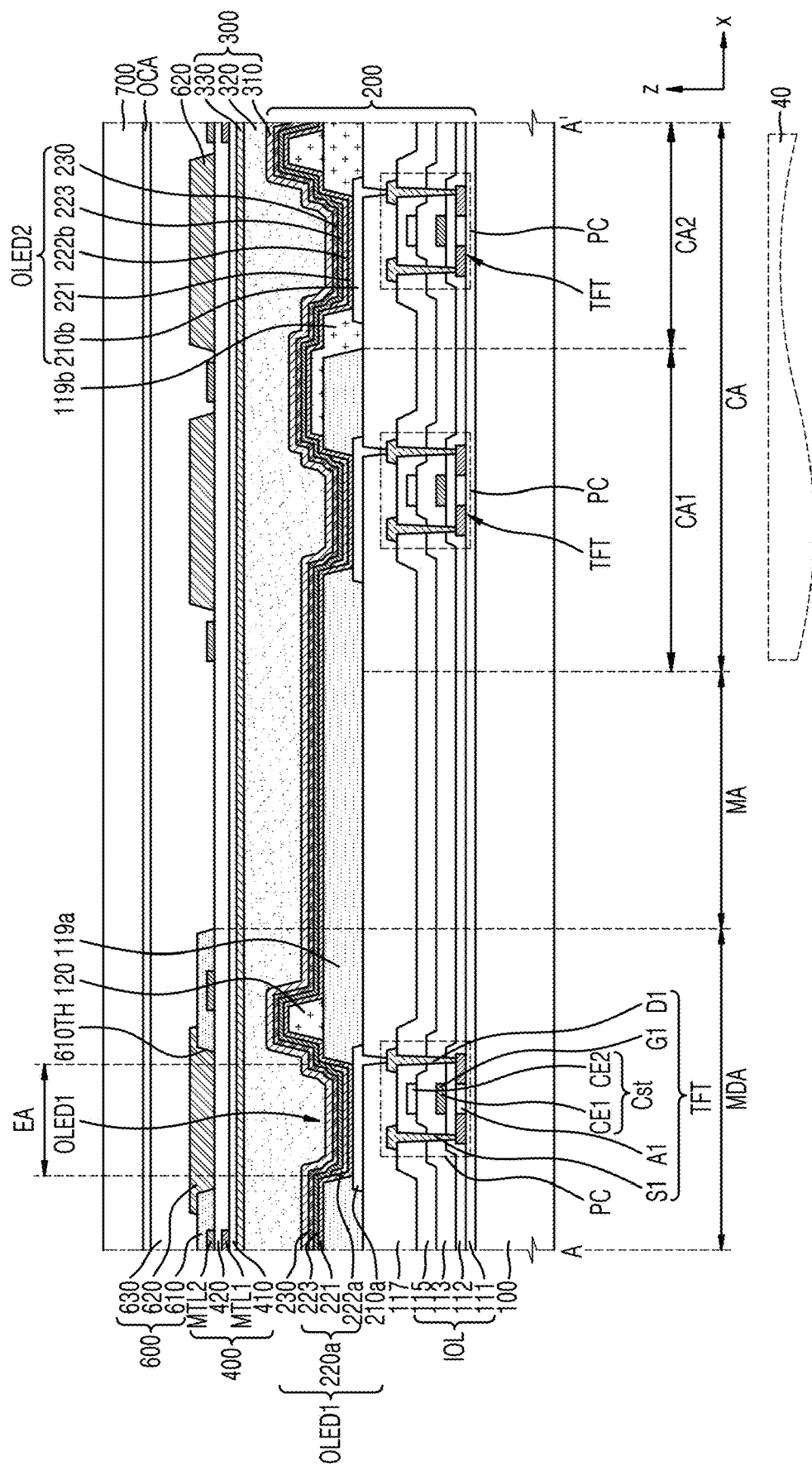
FIGS. 14A and 14B are cross-sectional views of a portion of the display area of FIG. 8B.
Figure 14B:
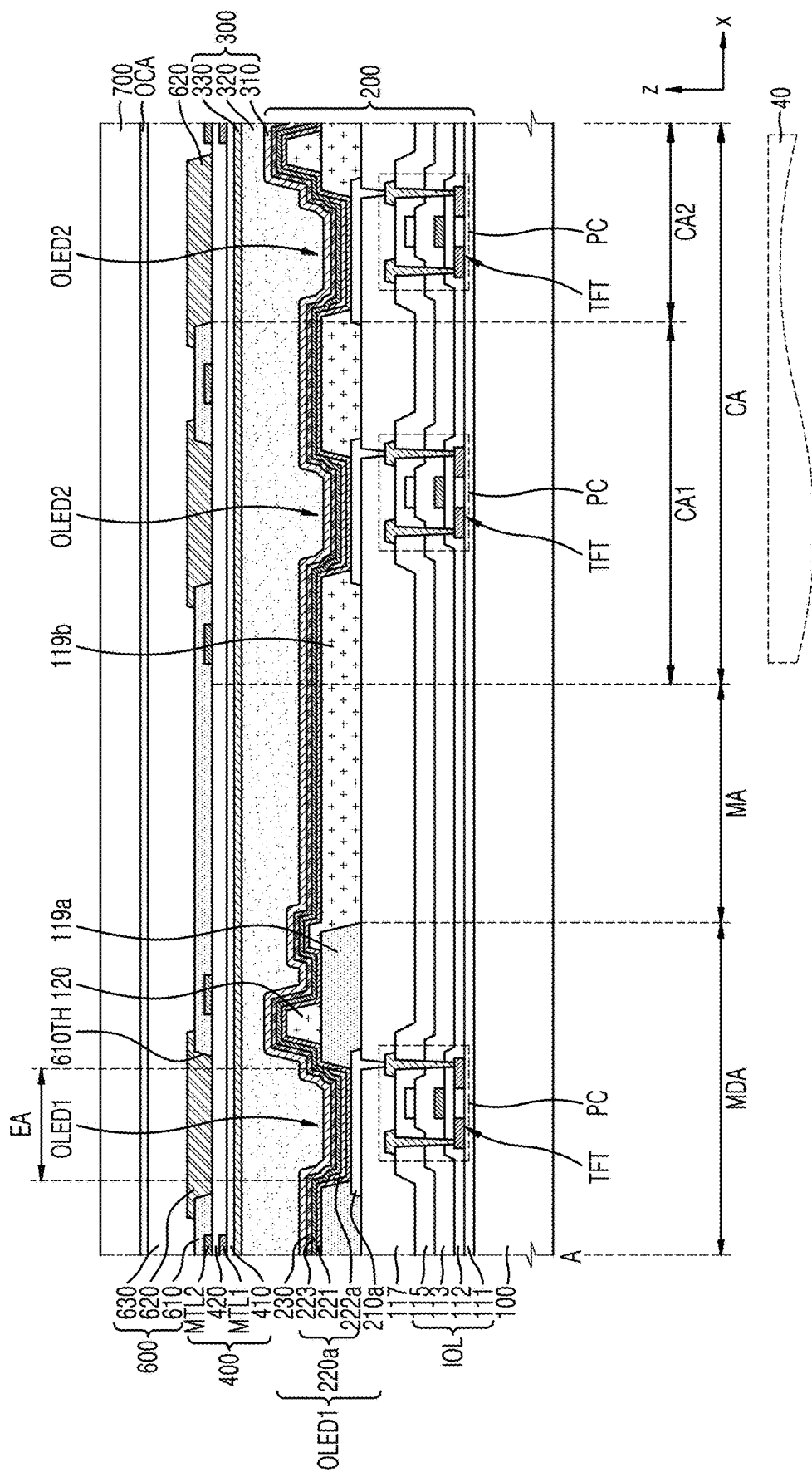

FIGS. 14A and 14B are cross-sectional views of a portion of the display area DA of FIG. 8B.

In an embodiment of FIG. 14A, the main display area MDA and the intermediate area MA are the same as those of FIG. 10, and in an embodiment of FIG. 14B, the main display area MDA and the intermediate area MA are the same as those of FIG. 11. Each embodiment of FIGS. 14A and 14B is different in the component area CA.

Referring to FIGS. 8B, 14A, and 14B, the component area CA may include a first component area CA1 and a second component area CA2. The first insulating layer 119a or the black matrix 610 is disposed in the first component area CA1, and the first insulating layer 119a and the black matrix 610 are not disposed in the second component area CA2. FIG. 14A shows a structure in which the first insulating layer 119a is disposed in an area to correspond to the first component area CA1, and FIG. 14B shows a structure in which the black matrix 610 is disposed in an area to correspond to the first component area CA1.

As an example, the first component area CA1 may arranged to form a mesh structure inside the component area CA as shown in FIG. 8B. The first component area CA1 includes one of the first insulating layer 119a and the black matrix 610 and do not include the other of the first insulating layer 119a and the black matrix 610, and thus the first component area CA1 may prevent an abrupt change in reflectivity between the component area CA and the main display area MDA.

As another embodiment, in the embodiments of FIGS. 10 to 14B, the pixel circuit PC including the first functional layer 221, the second functional layer 223, and/or the thin-film transistor may be omitted in at least a portion of the intermediate area MA.

Figure 15:
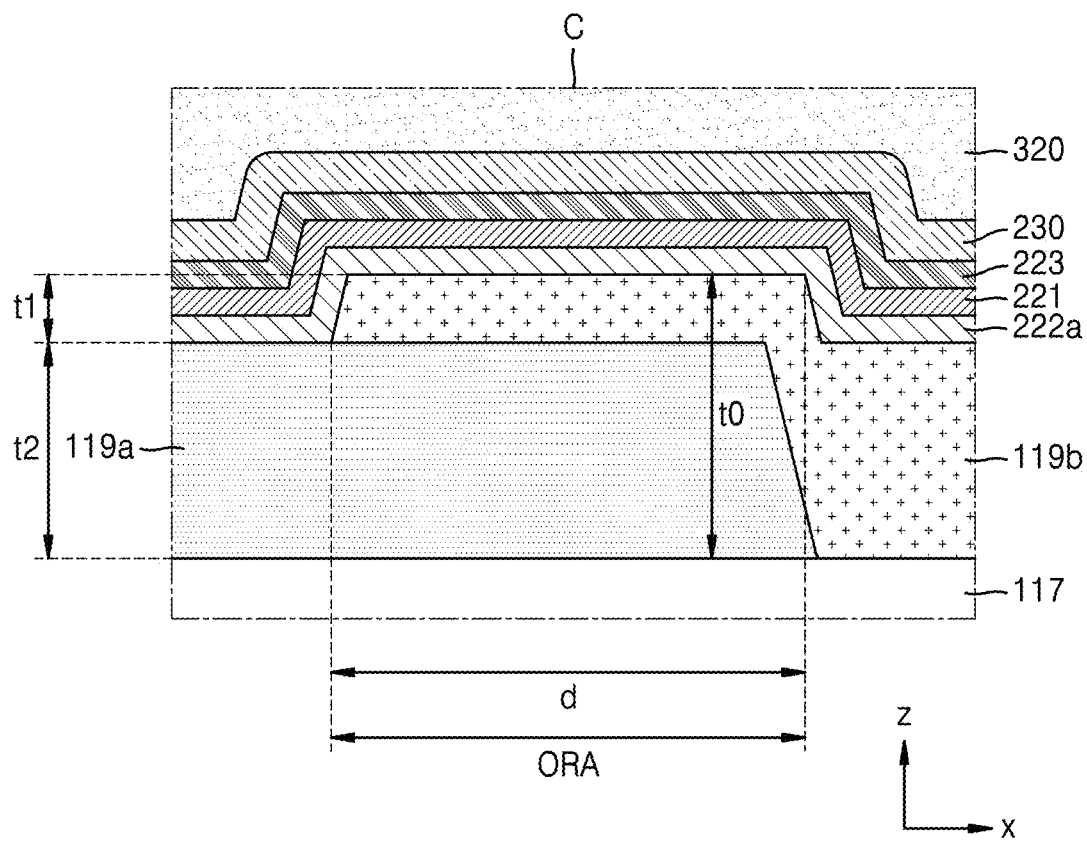
FIG. 15 is an enlarged cross-sectional view of region C of FIG. 13.

FIG. 15 is an enlarged cross-sectional view of a region C of FIGS. 10 to 13.

Referring to FIG. 15, the first insulating layer 119a may overlap the second insulating layer 119b in the boundary between the main display area MDA and the intermediate area MA. A sum t0 of the thicknesses of the first insulating layer 119a and the second insulating layer 119b in an overlapping area ORA may be about 1.2 times greater than a thickness t2 of the first insulating layer 119a or the second insulating layer 119b in an area excluding the overlapping area ORA.

In a manufacturing method according to an embodiment, the first insulating layer 119a may be formed first and then the second insulating layer 119b may be formed on the first insulating layer 119a. The first insulating layer 119a may be formed on the planarization insulating layer 117 to correspond to the main display area MDA, and be formed also in the intermediate area MA depending on the case. The second insulating layer 119b may be formed on the planarization insulating layer 117 to correspond to the component area CA on the first insulating layer 119a, and be formed also in the intermediate area MA. In an embodiment, the second insulating layer 119b may include the same material as the spacer 120 arranged on the first insulating layer 119a and may be simultaneously formed with the spacer 120.

A width d of an area in which the first insulating layer 119a overlaps the second insulating layer 119b may be about 1 μm to about 10 μm. In addition, in the case where a height t2 of the first insulating layer 119a is about 1 μm to about 10 μm, the thickness of the second insulating layer 119b arranged on the first insulating layer 119a may be about 0.1 μm to about 1 μm. As an example, a width d of the area in which the first insulating layer 119a overlaps the second insulating layer 119b may be about 3 μm, and in the case where the thickness t2 of the first insulating layer 119a is about 1.5 μm, a thickness t1 of the second insulating layer 119b on the first insulating layer 119a may be about 0.3 μm.

Figure 16A:
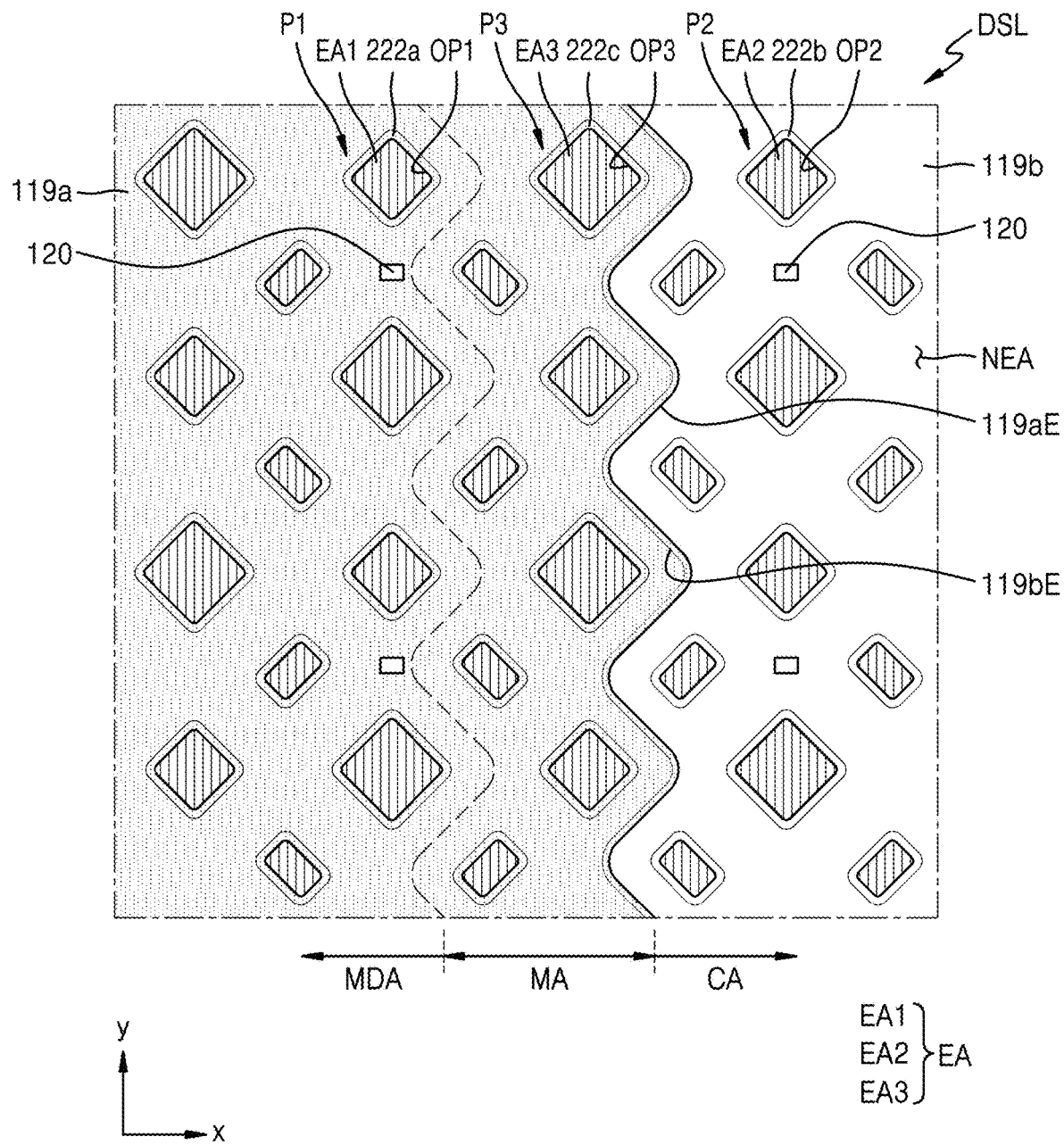
FIG. 16A is a plan view of a portion of a display area of a display layer according to an embodiment.
Figure 16B:
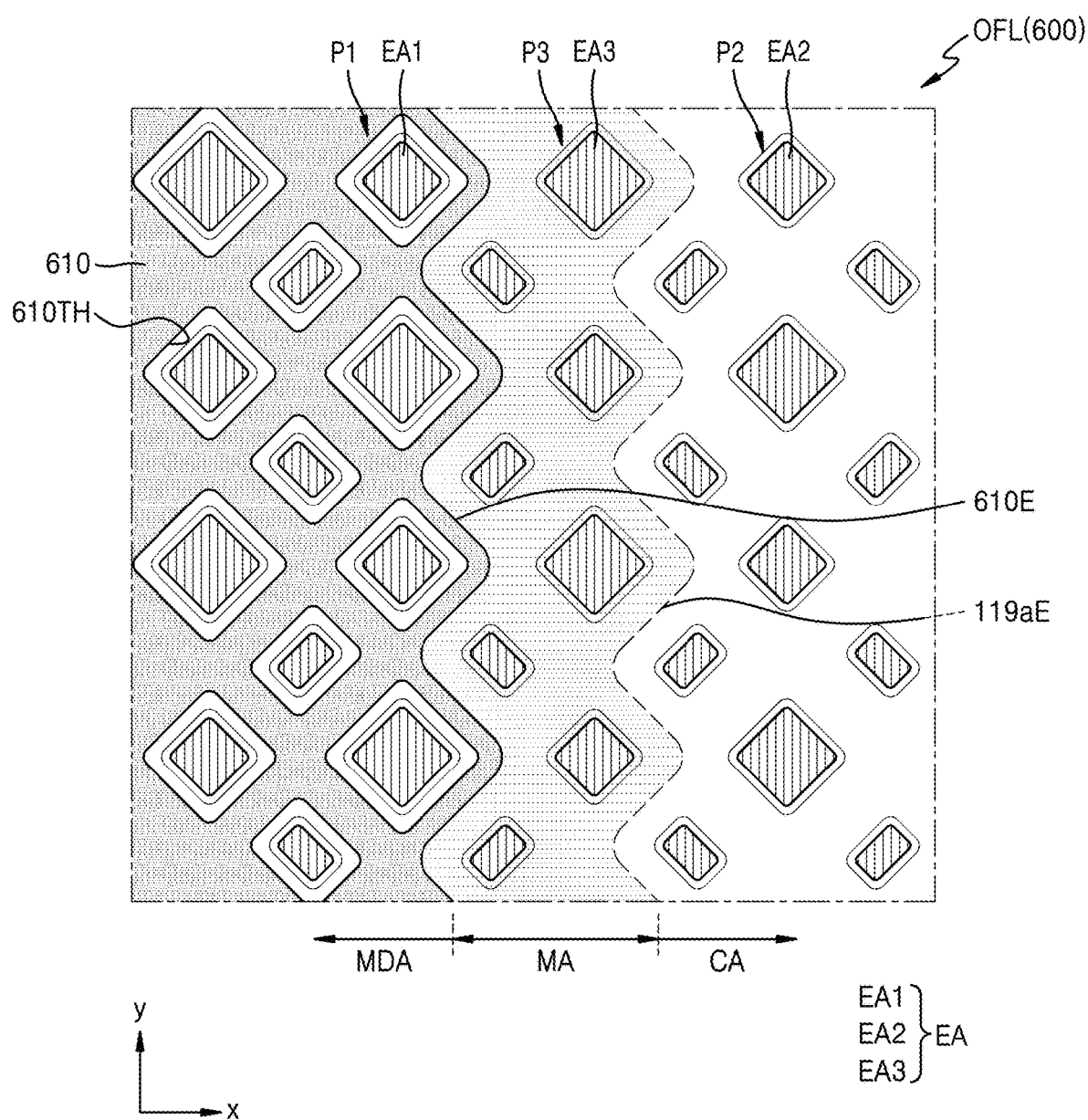
FIG. 16B is a plan view of a portion of a filter plate corresponding to an optical functional layer according to an embodiment.

FIG. 16A is a plan view of a portion of the display area DA of the display layer DPL according to an embodiment, and FIG. 16B is a plan view of a portion of the filter plate 600 corresponding to the optical functional layer according to an embodiment. FIGS. 17A, 17B, 18A, and 18B are views of modifications of FIGS. 16A and 16B.

Referring to FIGS. 16A and 16B, it is shown that the first insulating layer 119a is arranged to correspond to the main display area MDA and the intermediate area MA, the second insulating layer 119b is arranged to correspond to the component area CA, and the black matrix 610 is arranged to correspond to only the main display area MDA. FIGS. 16A and 16B may correspond to FIG. 10 or 12.

Referring to the display layer DPL of FIG. 16A, the first opening OP1 of the first pixel P1 in the main display area MDA may correspond to first emission areas EA1 in which the first emission layer 222a is arranged. The first insulating layer 119a may be arranged to correspond to a non-display area NEA between the first emission areas EA1. The first insulating layer 119a may include an opaque insulating material including a light-blocking material.

The second openings OP2 of the second pixels in the component area CA may correspond to second emission areas EA2 in which the second emission layer 222b is arranged. The second insulating layer 119b may be arranged to correspond to the non-emission area NEA between the second emission areas EA2. The second insulating layer 119b may include a transparent insulating material.

In the intermediate area MA, third openings OP3 of the third pixels P3 may correspond to third emission areas EA3 in which a third emission layer 222c is arranged. In the present embodiment, the first insulating layer 119a may be arranged to correspond to the intermediate area MA. The first insulating layer 119a may extend from the main display area MDA to the intermediate area MA. The first insulating layer 119a may be arranged to correspond to the non-emission area NEA between the third emission areas EA3.

An end 119aE of the first insulating layer 119a that forms the boundary between the intermediate area MA and the component area CA may be arranged in a zigzag shape between the third pixel P3 and the second pixel P2 in a plan view. This may be because the end 119aE of the first insulating layer 119a is arranged in a region between the third pixel P3 and the second pixel P2 to have substantially the same distance from edges of the third pixel P3 and the second pixel P2. In an embodiment, as shown in FIG. 16A, the end 119aE of the first insulating layer 119a may be arranged to surround two sides of the third emission area EA3 or the second emission area EA2 in a plan view. The shape of the end 119aE of the first insulating layer 119a may vary according to a configuration of the pixels. In another embodiment, the end 119aE of the first insulating layer 119a may have a straight line shape in one direction.

The spacer 120 may be arranged on the first insulating layer 119a. The spacers 120 may be arranged at a preset interval in the non-emission area NEA. The spacer 120 may include a material different from the first insulating layer 119a. As an example, the spacer 120 may include a transparent insulating material. As an example, the spacer 120 may include the same material as the second insulating layer 119b.

In the boundary between the intermediate area MA and the component area CA, the first insulating layer 119a may partially overlap the second insulating layer 119b. This may be understood as the overlapping area ORA described in FIG. 15. That is, an end 119bE of the second insulating layer 119b may be arranged on the first insulating layer 119a.

Referring to the optical functional layer OFL of FIG. 16B, the black matrix 610 may be arranged in only the main display area MDA. In the main display area MDA, the black matrix 610 may include holes 610TH respectively corresponding to the first emission areas EA1 of the first pixels P1 in the display layer DPL below.

An end 610E of the black matrix 610 that forms the boundary between the main display area MDA and the intermediate area MA may be arranged in a zigzag shape between the first pixel P1 and the third pixel P3 in a plan view. This is because the end 610E of the black matrix 610 is arranged in a region between the first pixel P1 and the third pixel P3 to have substantially the same distance from edges of the first pixel P1 and the third pixel P3. The shape of the end 610E of the black matrix 610 may vary according to a configuration of the pixels. In another embodiment, the end 610E of the black matrix 610 may have a straight line shape in one direction.

Figure 17A:
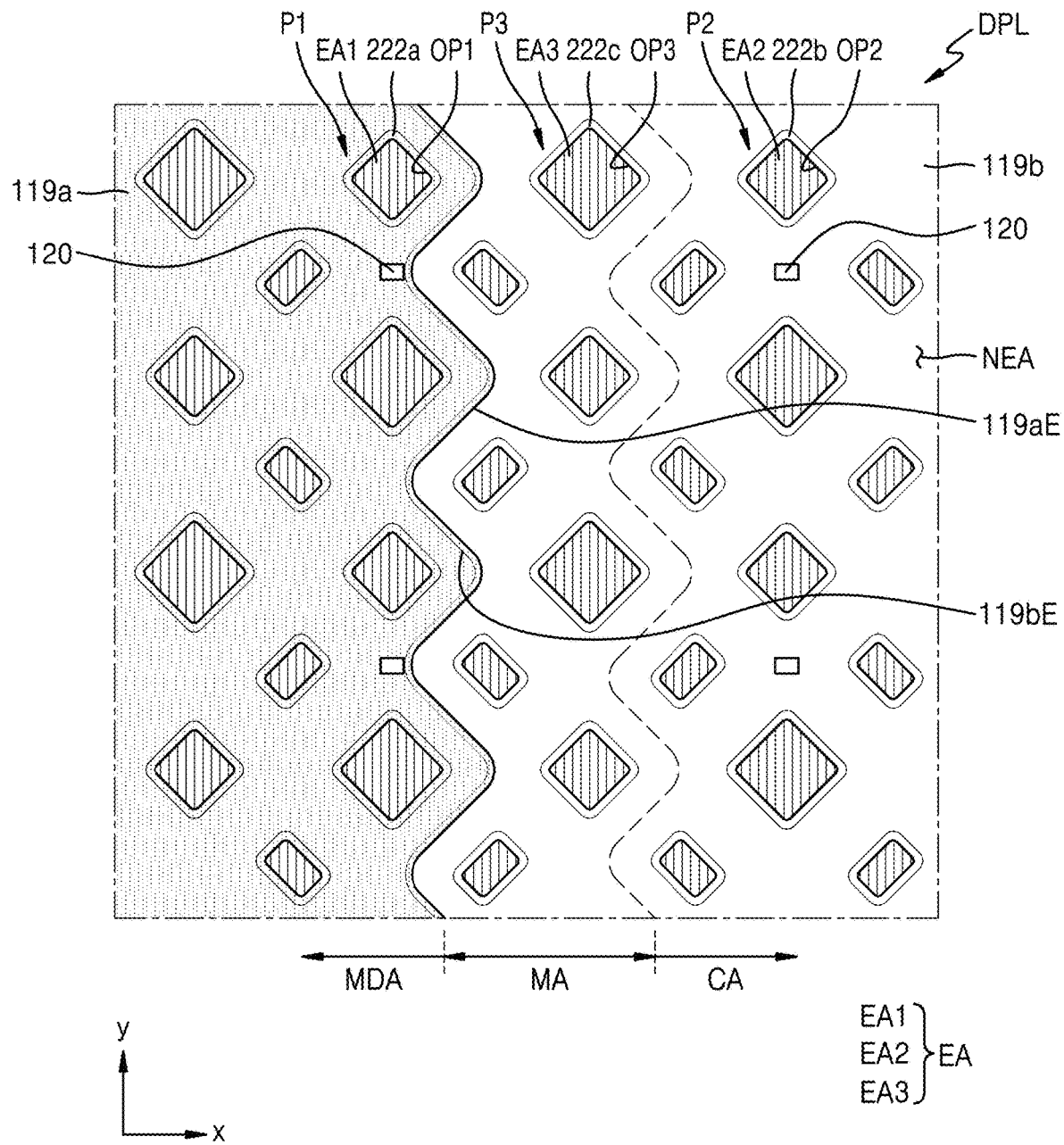
FIGS. 17A, 17B, 18A, and 18B are views of modifications of FIGS. 16A and 16B.
Figure 17B:
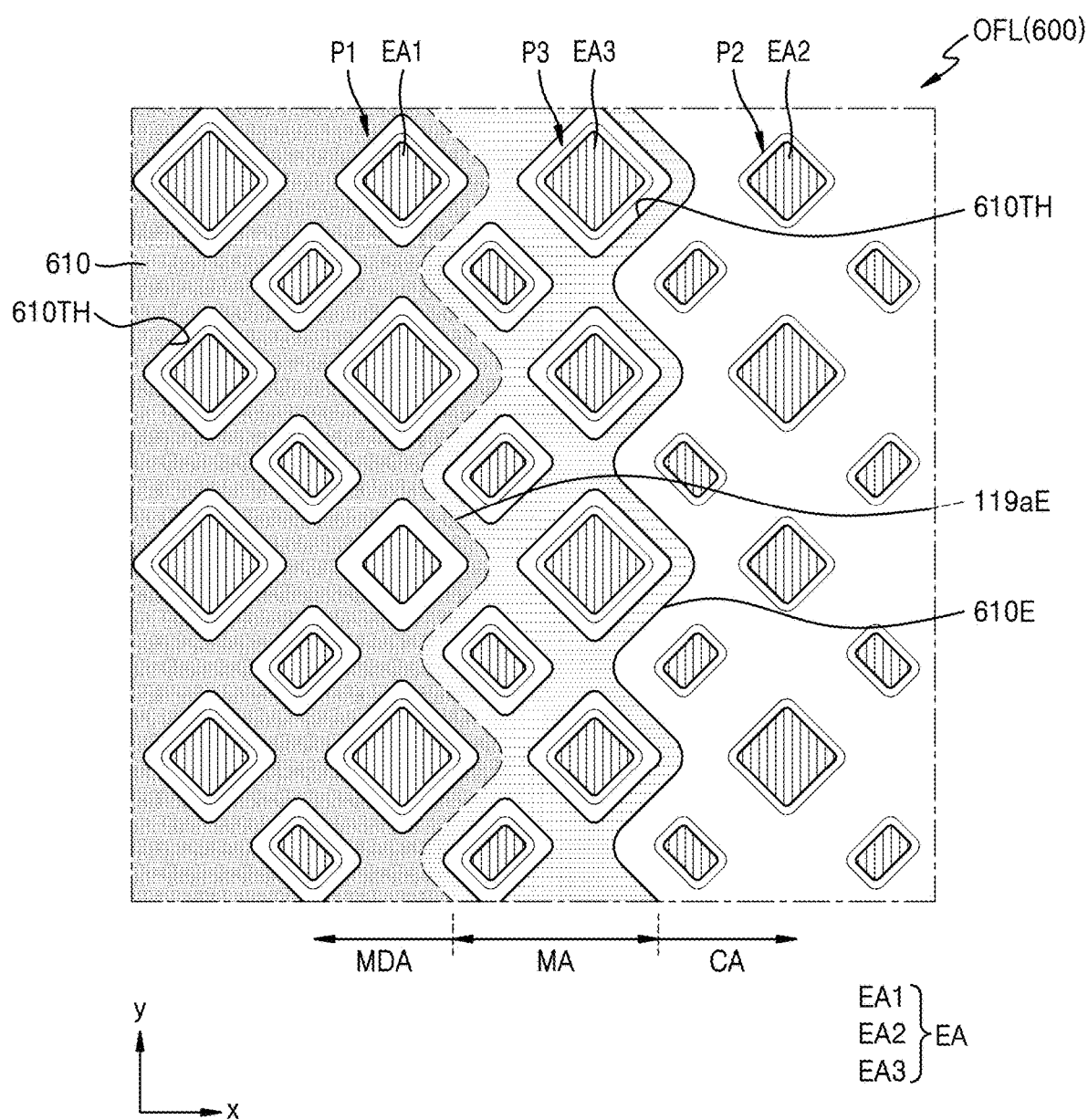

Referring to FIGS. 17A and 17B, it is shown that the first insulating layer 119a is arranged to correspond to the main display area MDA only, the second insulating layer 119b is arranged to correspond to the component area CA and the intermediate area MA, and the black matrix 610 is arranged to correspond to the main display area MDA and the intermediate area MA. FIGS. 17A and 17B may correspond to FIG. 11 or 13. The arrangement of the pixels, that is, the first pixel P1, the second pixel P2, and the third pixel P3 are the same as that of FIGS. 16A and 16B, and differences in the first insulating layer 119a, the second insulating layer 119b, and the black matrix 610 are mainly described below.

Referring to the display layer DPL of FIG. 17A, the end 119aE of the first insulating layer 119a that forms the boundary between the main display area MDA and the intermediate area MA may be arranged in a zigzag shape between the first pixel P1 and the third pixel P3 in a plan view. This may be because the end 119aE of the first insulating layer 119a is arranged in a region between the first pixel P1 and the third pixel P3 to have substantially the same distance from edges of the first pixel P1 and the third pixel P3. In an embodiment, as shown in FIG. 17A, the end 119aE of the first insulating layer 119a may be arranged to surround two sides of the first emission area EA1 or the third emission area EA3 in a plan view. The shape of the end 119aE of the first insulating layer 119a may vary according to a configuration of the pixels. In another embodiment, the end 119aE of the first insulating layer 119a may have a straight line shape in one direction.

In the boundary between the main display area MDA and the intermediate area MA, the first insulating layer 119a may partially overlap the second insulating layer 119b. This may be understood as the overlapping area ORA described in FIG. 15. That is, the end 119bE of the second insulating layer 119b may be arranged on the first insulating layer 119a.

Referring to the optical functional layer OFL of FIG. 17B, the black matrix 610 may extend from the main display area MDA to the intermediate area MA. Accordingly, in the main display area MDA and the intermediate area MA, the black matrix 610 may include holes 610TH corresponding to the first emission area EA1 of the first pixel P1 and the third emission area EA3 of the third pixel P3 in the display layer DPL below.

The end 610E of the black matrix 610 that forms the boundary between the main display area MDA and the intermediate area MA may be arranged in a zigzag shape between the first pixel P1 and the third pixel P3 in a plan view. This is because the end 610E of the black matrix 610 is arranged in a region between the first pixel P1 and the third pixel P3 to have substantially the same distance from edges of the first pixel P1 and the third pixel P3. The shape of the end 119aE of the first insulating layer 119a may vary according to a configuration of the pixels. In another embodiment, the end 610E of the black matrix 610 may have a straight line shape in one direction.

Figure 18A:
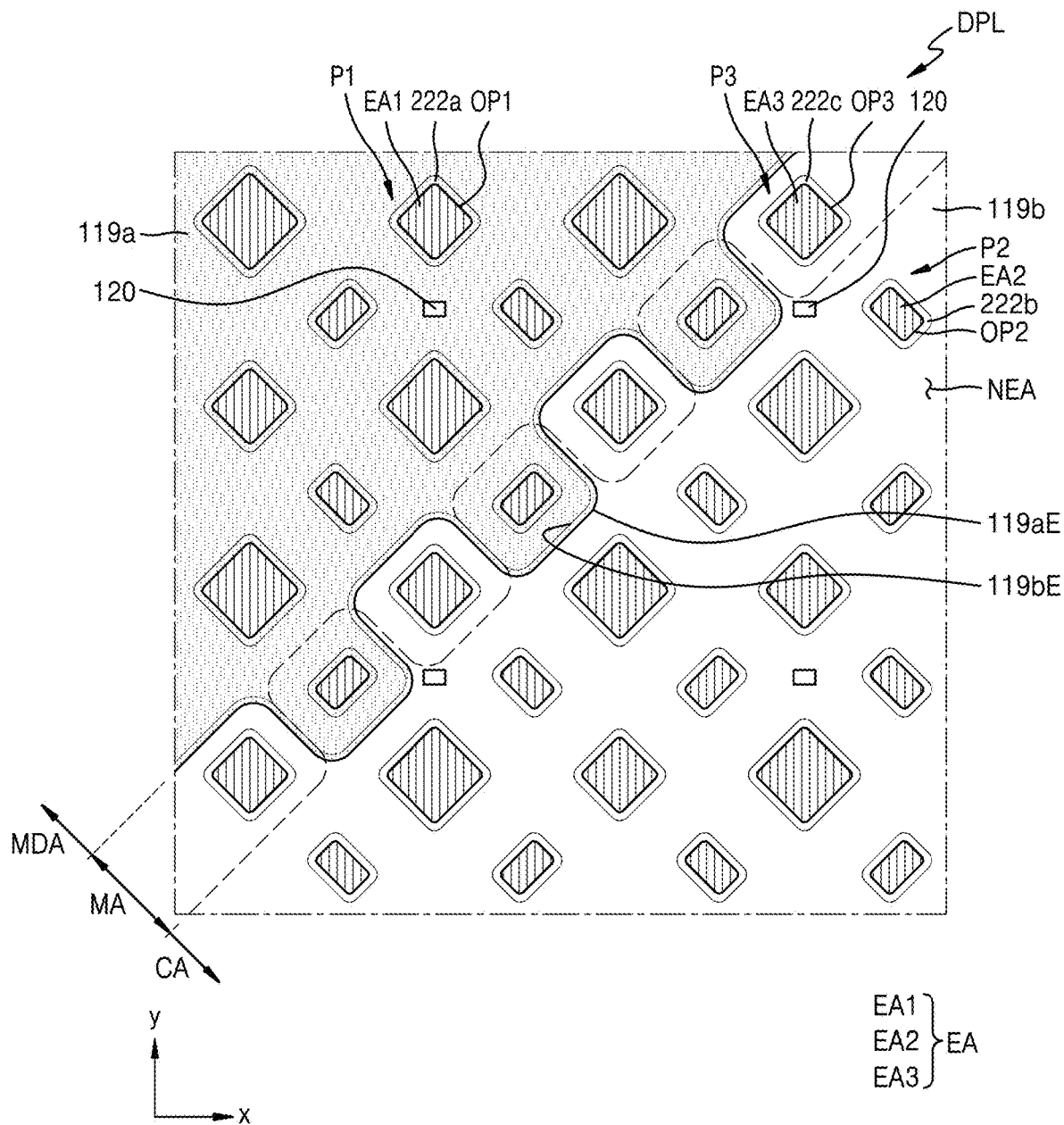
Figure 18B:
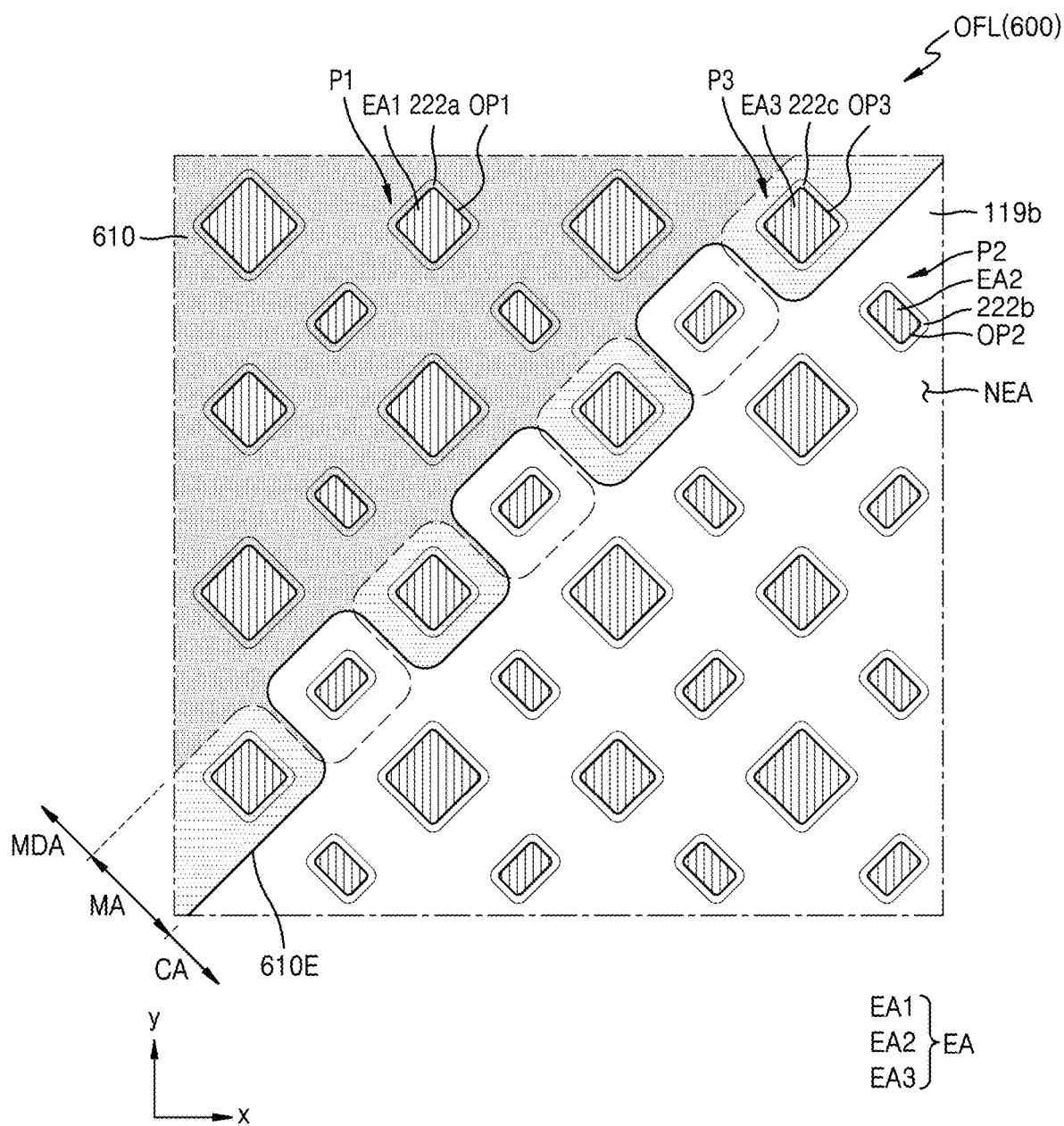

Referring to FIGS. 18A and 18B, it is shown that the first insulating layer 119a is arranged to correspond to the main display area MDA and the intermediate area MA, the second insulating layer 119b is arranged to correspond to the component area CA and the intermediate area MA, and the black matrix 610 is arranged to correspond to the main display area MDA and the intermediate area MA. The arrangement of the pixels, that is, the first pixel P1, the second pixel P2, and the third pixel P3 are the same as that of FIGS. 16A and 16B, and differences in the first insulating layer 119a, the second insulating layer 119b, and the black matrix 610 are mainly described below.

In the present embodiment, a third emission area EA3 of one of third pixels P3 disposed adjacent to each other in the intermediate area MA may be defined by the first insulating layer 119a, and a third emission area EA3 of the other of the third pixels P3 may be defined by the second insulating layer 119b.

In the intermediate area MA, the first insulating layer 119a may not overlap the black matrix 610. That is, at least a portion of the first insulating layer 119a and at least a portion of the black matrix 610 may be arranged to correspond to the intermediate area MA and alternately arranged with each other in the intermediate area MA, not overlapping each other.

Accordingly, in a plan view as in FIG. 18A, the end 119aE of the first insulating layer 119a may be arranged in a zigzag shape in the intermediate area MA. In an embodiment, as in FIG. 18A, the end 119aE of the first insulating layer 119a may be arranged to surround three sides of the third emission area EA3.

The first insulating layer 119a may overlap the second insulating layer 119b in a portion of the intermediate area MA. In addition, the first insulating layer 119a may overlap the second insulating layer 119b in a portion of the main display area MDA and the intermediate area MA, and a portion of the component layer CA and the intermediate area MA. This may be understood as the overlapping area ORA described in FIG. 15. The end 119bE of the second insulating layer 119b may be arranged on the first insulating layer 119a.

FIG. 19 is a plan view of a portion of the display area DA of the display panel 10 according to an embodiment.

Referring to FIG. 19, the component area CA may include the transmission area TA. In other words, FIG. 19 may correspond to FIG. 9A or 9B described above.

The first pixels P1 may be arranged in the main display area MDA. The first pixels P1 may include the red first pixel P1r, the green first pixel P1g, and the blue first pixel P1b. Both the first insulating layer 119a and the black matrix 610 may be arranged to correspond to the main display area MDA, and the first insulating layer 119a may overlap the black matrix 610 in the main display area MDA.

The second pixels P2 may be arranged in the component area CA. The second pixels P2 may include the red second pixel P2r, the green second pixel P2g, and the blue second pixel P2b. In the present embodiment, the black matrix 610 may not be arranged in the component area CA, and a portion of the first insulating layer 119a may be arranged in the component area CA. Therefore, in FIG. 19, the first insulating layer 119a may define not only the first pixel P1 in the main display area MDA but also the second emission areas EA2 of the second pixels P2 in the component area CA. This is because, in the case where a separate transmission area TA is arranged in the component area CA, a sufficient amount of light for the component 40 (see FIG. 4) to operate may be provided through the transmission area TA. In another embodiment, even in the case where a separate transmission area TA is provided inside the component area CA, the second insulating layer 119b including the light-transmissive material may be arranged in a partial region.

The intermediate area MA may be arranged in at least a portion between the main display area MDA and the component area CA. In an embodiment, the third pixels P3 may be arranged in the intermediate area MA. The third pixels P3 may include the red third pixel P3r, the green third pixel P3g, and the blue third pixel P3b. In this case, the intermediate area MA is a region in which the first insulating layer 119a or the black matrix 610 is arranged. The intermediate area MA may be defined as a region in which the first insulating layer 119a does not overlap the black matrix 610. FIG. 19 shows the case where the black matrix 610 is not arranged and the first insulating layer 119a is arranged to correspond to the intermediate area MA.

As described above, only one of the first insulating layer 119a and the black matrix 610 each including a light-blocking material is arranged in the intermediate area MA, and thus, the intermediate area MA may have a relatively high external light reflectivity compared to the main display area MDA and have a relatively low external light reflectivity compared to the component area CA. Through this configuration, by gradating the boundary lines of the main display area MDA and the component area CA, a deterioration of an image due to an abrupt change in reflectivity between the main display area MDA and the component area CA may be reduced.

In the above, though only the display apparatus has been mainly described, the present disclosure is not limited thereto. As an example, a method of manufacturing a display apparatus by using the display apparatus also falls within the scope of the present disclosure.

According to an embodiment, a display panel in which a boundary visibility is reduced in the component area, and a display apparatus including the display panel may be implemented. However, the scope of the present disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
    a display panel including a main display area, a component area and an intermediate area disposed between the main display area and the component area; and
    a component disposed below the display panel in an area corresponding to the component area,
    wherein the display panel includes:
        a substrate;
        a plurality of pixel electrodes including a first pixel electrode disposed in the main display area, a second pixel electrode disposed in the component area and a third pixel electrode disposed in the intermediate area;
        a first insulating layer including a light-blocking material and disposed on the substrate, the first insulating layer exposing central portions of pixel electrodes; and
        an optical functional layer disposed on the first insulating layer and including a black matrix, the black matrix exposing the pixel electrodes, and wherein the light-blocking material and the black matrix are disposed in the main display area, either the light-blocking material or the black matrix is disposed in the intermediate display area, and the light-blocking material and the black matrix are not disposed in the component area.

2. The display apparatus of claim 1, further comprising a second insulating layer disposed in an area corresponding to the component area and including a light-transmissive material, covering edges of the second pixel electrode, and including a second opening that exposes a central portion of the second pixel electrode.

3. The display apparatus of claim 2, wherein reflectivity of the intermediate area is greater than reflectivity of the main display area and less than reflectivity of the component area.

4. The display apparatus of claim 2, wherein the component includes at least one of an illuminance sensor and a proximity sensor.

5. The display apparatus of claim 2, wherein the component includes a camera.

6. The display apparatus of claim 2, further comprising a spacer disposed on the first insulating layer,
wherein the second insulating layer and the spacer include a same material.

7. The display apparatus of claim 2, wherein the first insulating layer at least partially overlaps the second insulating layer.

8. A display panel comprising:
a substrate including a main display area, a component area under which at least one component is disposed and an intermediate area disposed between the main display area and the component area;
pixel electrodes including a first pixel electrode disposed in the main display area, a second pixel electrode disposed in the component area, and a third pixel electrode disposed in the intermediate area;
a first insulating layer including a light-blocking material and disposed on the substrate, the first insulating layer exposing central portions of pixel electrodes; and
an optical functional layer disposed on the first insulating layer and including a black matrix, the black matrix exposing the pixel electrodes,
wherein the light-blocking material and the black matrix are disposed in the main display area, either the light-blocking material or the black matrix is disposed in the intermediate display area, and the light-blocking material and the black matrix are not disposed in the component area.

9. The display panel of claim 8, wherein the light-blocking material is disposed in areas corresponding to the main display area and the intermediate area and is not disposed in an area corresponding to the component area, and the black matrix is disposed in an area corresponding to the main display area and is not disposed in areas corresponding to the intermediate area and the component area.

10. The display panel of claim 8, wherein the light-blocking material is disposed in an area corresponding to the main display area and is not disposed in areas corresponding to the intermediate area and the component area, and the black matrix is disposed in areas corresponding to the main display area and the intermediate area and is not disposed in an area corresponding to the component area.

11. The display panel of claim 8, wherein the first insulating layer or the black matrix is disposed in an area corresponding to the intermediate area.

12. The display panel of claim 8, wherein an edge of the first insulating layer has a zigzag shape.

13. The display panel of claim 12, wherein an edge of the black matrix has protrusions and recessions, and
wherein the protrusions of the black matrix are alternatingly disposed with protrusions of the first insulating layer in the intermediate area.

14. The display panel of claim 8, wherein the component area has a transmission area.

15. The display panel of claim 14, wherein the first insulating layer is disposed in an area corresponding to at least a portion of the component area that excludes the transmission area.

16. The display panel of claim 8, further comprising a second insulating layer including a light-transmissive material and disposed in the component area, covering edges of the second pixel electrode, and including an opening that exposes a central portion of the second pixel electrode.

17. The display panel of claim 16, wherein the optical functional layer further includes color filters disposed in areas corresponding to the pixel electrodes.

18. The display panel of claim 16, wherein the light-blocking material is disposed in the intermediate display area.

19. The display panel of claim 16, wherein the black matrix is disposed in the intermediate display area.

20. The display panel of claim 16, further comprising a spacer disposed on the first insulating layer and the second insulating layer,
wherein the spacer includes a same material as the second insulating layer.

21. The display panel of claim 16, wherein the first insulating layer at least partially overlaps the second insulating layer.

22. The display panel of claim 21, wherein at least a portion of the second insulating layer is disposed on the first insulating layer in a portion where the first insulating layer overlaps the second insulating layer.

23. The display panel of claim 21, wherein a width of a portion where the first insulating layer overlaps the second insulating layer in a plan view is greater than a thickness of the first insulating layer.

24. The display panel of claim 23, wherein a thickness of the second insulating layer in the portion where the first insulating layer overlaps the second insulating layer is less than a thickness of the first insulating layer.

* * * * *